US012713780B2

(12) United States Patent
Jung et al.

(10) Patent No.: US 12,713,780 B2
(45) Date of Patent: Aug. 18, 2026

(54) DISPLAY APPARATUS

(71) Applicant: Samsung Display Co., Ltd., Yongin-si (KR)

(72) Inventors: Jaesoo Jung, Yongin-si (KR); Moosoon Ko, Yongin-si (KR); Kohei Ebisuno, Yongin-si (KR); Sunggeun Bae, Yongin-si (KR); Sanghoon Oh, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 490 days.

(21) Appl. No.: 18/492,708

(22) Filed: Oct. 23, 2023

(65) Prior Publication Data

US 2024/0324303 A1 Sep. 26, 2024

(30) Foreign Application Priority Data

Mar. 24, 2023 (KR) ........................ 10-2023-0039140
May 4, 2023 (KR) ........................ 10-2023-0058494

(51) Int. Cl.
*H10K 59/122* (2023.01)
*H10K 59/131* (2023.01)

(52) U.S. Cl.
CPC ......... *H10K 59/122* (2023.02); *H10K 59/131* (2023.02)

(58) Field of Classification Search
CPC ............... H10K 59/122; H10K 59/131; H10K 59/1315; H10K 59/80522
See application file for complete search history.

(56) References Cited

U.S. PATENT DOCUMENTS 10,516,004 B2 12/2019 Park et al.
11,227,905 B2 1/2022 Kim et al.
2014/0183501 A1* 7/2014 Kim .................... H10K 59/122 438/34

FOREIGN PATENT DOCUMENTS

KR 10-2015-0050204 A 5/2015
KR 10-2015-0061920 A 6/2015
KR 10-2015-0127368 A 11/2015
KR 10-2018-0079059 A 7/2018
KR 10-2020-0069729 A 6/2020

* cited by examiner

*Primary Examiner* — Anne M Hines
*Assistant Examiner* — Jose M Diaz
(74) *Attorney, Agent, or Firm* — Womble Bond Dickinson (US) LLP

(57) ABSTRACT

A display apparatus includes: a display element including a pixel electrode on a substrate; a bus line spaced from the pixel electrode, and located at the same layer as that of the pixel electrode; a pixel-defining layer defining an emission area of the display element, the pixel-defining layer including: an opening overlapping with the pixel electrode, and exposing at least a portion of the pixel electrode; and a hole exposing a portion of the bus line adjacent to the pixel electrode; a separator on the pixel-defining layer; an intermediate layer on the pixel electrode; and an opposite electrode on the intermediate layer. In a plan view, the separator surrounds the pixel electrode and the hole together. The bus line includes: a first line layer; and a second line layer on the first line layer, and including a tip protruding more than an edge of the first line layer.

20 Claims, 18 Drawing Sheets

DISPLAY APPARATUS

CROSS-REFERENCE TO RELATED APPLICATIONS

This application claims priority to and the benefit of Korean Patent Application Nos. 10-2023-0039140, filed on Mar. 24, 2023, and 10-2023-0058494, filed on May 4, 2023, in the Korean Intellectual Property Office, the entire disclosures of all of which are incorporated by reference herein.

BACKGROUND

1. Field

One or more embodiments of the present disclosure relate to a display apparatus, and more particularly, to a display apparatus in which a leakage current may be reduced, and which is capable of effectively transmitting an electrical signal to a plurality of opposite electrodes.

2. Description of the Related Art

A display apparatus may include some layers, for example, such as an intermediate layer between a pixel electrode and an opposite electrode, that are commonly provided in a plurality of display elements. Accordingly, when a current is supplied to one display element, the current is also supplied to neighboring elements through a layer commonly provided in the plurality of display elements, and color purity of the display apparatus may be degraded. As such, the display apparatus may include a separator or the like.

The above information disclosed in this Background section is for enhancement of understanding of the background of the present disclosure, and therefore, it may contain information that does not constitute prior art.

SUMMARY

In a display apparatus according to a comparative example, in a process of transmitting an electrical signal to an opposite electrode, the electrical signal may not be effectively transmitted to a plurality of opposite electrodes.

One or more embodiments of the present disclosure are directed to a display apparatus that displays a high-quality image. However, the present disclosure is not limited thereto.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a display element including a pixel electrode on a substrate; a bus line spaced from the pixel electrode, and located at the same layer as that of the pixel electrode; a pixel-defining layer defining an emission area of the display element, the pixel-defining layer including: an opening overlapping with the pixel electrode, and exposing at least a portion of the pixel electrode; and a hole exposing a portion of the bus line adjacent to the pixel electrode; a separator on the pixel-defining layer; an intermediate layer on the pixel electrode; and an opposite electrode on the intermediate layer. In a plan view, the separator surrounds the pixel electrode and the hole together. The bus line includes: a first line layer; and a second line layer on the first line layer, the second line layer including a tip protruding more than an edge of the first line layer.

In an embodiment, the opposite electrode may be electrically connected to at least one of the first line layer or the second line layer.

In an embodiment, the bus line may include: a line extending in one direction without overlapping with the pixel electrode; and a line extending in a direction different from the one direction without overlapping with the pixel electrode.

In an embodiment, the tip in an area exposed by the hole may protrude in a direction toward the pixel electrode.

In an embodiment, the tip in the area exposed by the hole may also protrude in a direction opposite to the pixel electrode.

In an embodiment, in a plan view, the bus line in an area exposed by the hole may include a loop shape along an edge of the hole.

In an embodiment, the first line layer may include a first opening overlapping with the hole, and passing through a bottom surface of the first line layer from an upper surface of the first line layer. The second line layer may include a second opening overlapping with the hole, and passing through a bottom surface of the second line layer from an upper surface of the second line layer. A diameter of the second opening may be less than a diameter of the first opening.

In an embodiment, the separator may have a reverse tapered structure in which an upper width is greater than a lower width.

In an embodiment, the display apparatus may further include a third line layer between the first line layer and the second line layer, the third line layer including a conductive material different from a conductive material of the first line layer.

In an embodiment, the pixel electrode may include a first sub-pixel electrode, and a second sub-pixel electrode on the first sub-pixel electrode, and the second sub-pixel electrode may protrude more than an edge of the first sub-pixel electrode.

In an embodiment, the intermediate layer may include a lower emission layer, an upper emission layer, and a charge generation layer between the lower emission layer and the upper emission layer.

According to one or more embodiments of the present disclosure, a display apparatus includes: a first display element including a first pixel electrode on a substrate; a second display element including a second pixel electrode on the substrate; a bus line spaced from the first pixel electrode and the second pixel electrode, and located at the same layer as that of the first pixel electrode and the second pixel electrode on the substrate; a pixel-defining layer defining emission areas of the first display element and the second display element, the pixel-defining layer including: an opening overlapping with the first pixel electrode, and exposing at least a portion of the first pixel electrode; an opening overlapping with the second pixel electrode, and exposing at least a portion of the second pixel electrode; a first hole exposing a portion of the bus line adjacent to the first pixel electrode; and a second hole exposing a portion of the bus line adjacent to the second pixel electrode; a separator on the pixel-defining layer; a first intermediate layer on the first pixel electrode; a second intermediate layer on the second pixel electrode, and spaced from the first intermediate layer; a first opposite electrode on the first intermediate layer; and a second opposite electrode on the second intermediate layer, and spaced from the first opposite electrode. In a plan view, the separator is located between the first pixel electrode and the second pixel electrode. The bus line includes a first line layer, and a second line layer on the first line layer, the second line layer including a tip protruding more than an edge of the first line layer.

In an embodiment, the first opposite electrode may be electrically connected to at least one of the first line layer or the second line layer in an area of the bus line exposed by the first hole, and the second opposite electrode may be electrically connected to at least one of the first line layer or the second line layer in an area of the bus line exposed by the second hole.

In an embodiment, the first opposite electrode may be in direct contact with a side surface of the first line layer in an area of the bus line exposed by the first hole, and the second opposite electrode may be in direct contact with a side surface of the first line layer in an area of the bus line exposed by the second hole.

In an embodiment, the separator may have a reverse tapered structure in which an upper width is greater than a lower width; a dummy intermediate layer may be on the separator; a dummy opposite electrode may be on the dummy intermediate layer; the first intermediate layer and the second intermediate layer may be disconnected from the dummy intermediate layer; and the first opposite electrode and the second opposite electrode may be disconnected from the dummy opposite electrode.

In an embodiment, the first opposite electrode and the second opposite electrode may be electrically connected to each other by the bus line.

In an embodiment, in a plan view, the separator may surround the first pixel electrode and the first hole together, and may surround the second pixel electrode and the second hole together.

According to one or more embodiments of the present disclosure, a display apparatus includes: a display element including a pixel electrode on a substrate; a bus line spaced from the pixel electrode, and located at the same layer as that of the pixel electrode; a pixel-defining layer defining an emission area of the display element, the pixel-defining layer including: an opening overlapping with the pixel electrode, and exposing at least a portion of the pixel electrode; and a hole exposing a portion of the bus line adjacent to the pixel electrode; an intermediate layer on the pixel electrode; and an opposite electrode on the intermediate layer. The pixel-defining layer includes a separator, and in a plan view, the separator surrounds the pixel electrode and the hole together. The bus line includes a first line layer, and a second line layer on the first line layer, the second line layer including a tip protruding more than an edge of the first line layer.

In an embodiment, the separator may be formed by removing a portion of the pixel-defining layer so that an upper width of the separator may be greater than a lower width of the separator.

In an embodiment, the opposite electrode may be electrically connected to at least one of the first line layer or the second line layer.

The above and other aspects and features of the present disclosure will become more apparent from the detailed description, the accompanying drawings, the claims, and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
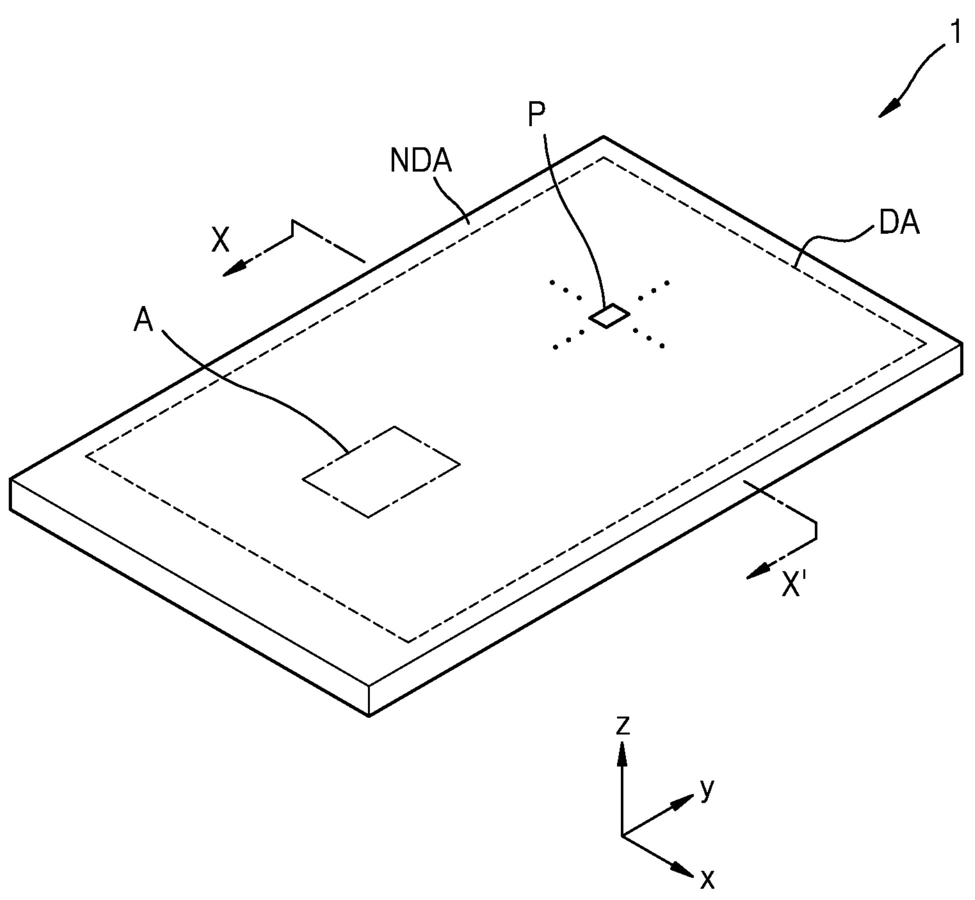
FIG. 1 is a perspective view schematically illustrating a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used herein, the expression "A and B overlap with each other" may indicate that when a plane (e.g., an x-y plane) perpendicular to one direction (e.g., a z-axis direction) is viewed from the one direction, at least a portion of A and at least a portion B are arranged to overlap with each other on the plane.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. For example, the expression "an element B is directly disposed on an element A" may mean that an additional adhesive layer or adhesive member is not arranged between the element A and the element B. In this case, the element B may be formed through a continuous process on a base surface provided by the element A, after the element A is formed. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. For example, "about" may be construed to include values in a range of ±30%, ±20%, ±10%, or ±5%, of a numerical value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view schematically illustrating a display apparatus 1 according to an embodiment.

Referring to FIG. 1, a display panel provided in the display apparatus 1 may include a display area DA, and a non-display area NDA located outside the display area DA. The display panel having the display area DA may be understood as a substrate 100 (e.g., see FIG. 3) included in the display panel has the display area DA. Hereinafter, it is described that the substrate 100 has the display area DA and the non-display area NDA, for convenience.

The display area DA may display an image through pixels P arranged in the display area DA. The non-display area NDA is arranged outside the display area DA, and no image is displayed in the non-display area NDA. The non-display area NDA may entirely surround (e.g., around a periphery of) the display area DA. A driver or the like for providing an electrical signal or power to the display area DA may be arranged in the non-display area NDA. A pad, which is an area to which an electronic element, such as a printed circuit board or the like, may be electrically connected, may be arranged in the non-display area NDA.

In an embodiment, FIG. 1 shows a polygon (e.g., a quadrangle) in which a length of the display area DA in an x direction is less than a length of the display area DA in a y direction. However, the present disclosure is not limited thereto. In another embodiment, the display area DA may be an N-sided polygon (where N is a natural number greater than or equal to 3), or may have various suitable shapes, such as a circle or an ellipse. In FIG. 1, a corner portion of the display area DA has a shape including a vertex at which a straight line and a straight line are in contact with each other. However, in another embodiment, the display region DA may have a polygonal shape with a rounded corner portion.

For convenience, the display apparatus 1 is illustrated as an electronic device that is a smartphone. However, the present disclosure is not limited thereto. The display apparatus 1 may be applied to various suitable portable electronic devices, such as mobile phones, smartphones, tablet personal computers (PCs), mobile communication terminals, electronic notebooks, electronic books, portable multimedia players (PMPs), navigations, and ultra mobile PCs (UMPCs), as well as to various suitable products, such as televisions, laptops, monitors, advertisement boards, and Internet of Things (IoT) devices. In addition, the display apparatus 1 according to an embodiment may be applied to wearable devices, such as smart watches, watch phones, glasses-type displays, and head-mounted displays (HMDs). In addition, the display apparatus 1 according to an embodiment may be applied to center information displays (CIDs) arranged on a center fascia or a dashboard of a vehicle, room mirror displays replacing side-view mirrors of a vehicle, and display screens arranged on rear sides of the front seats as an entertainment for the backseats of a vehicle.

Figure 2:
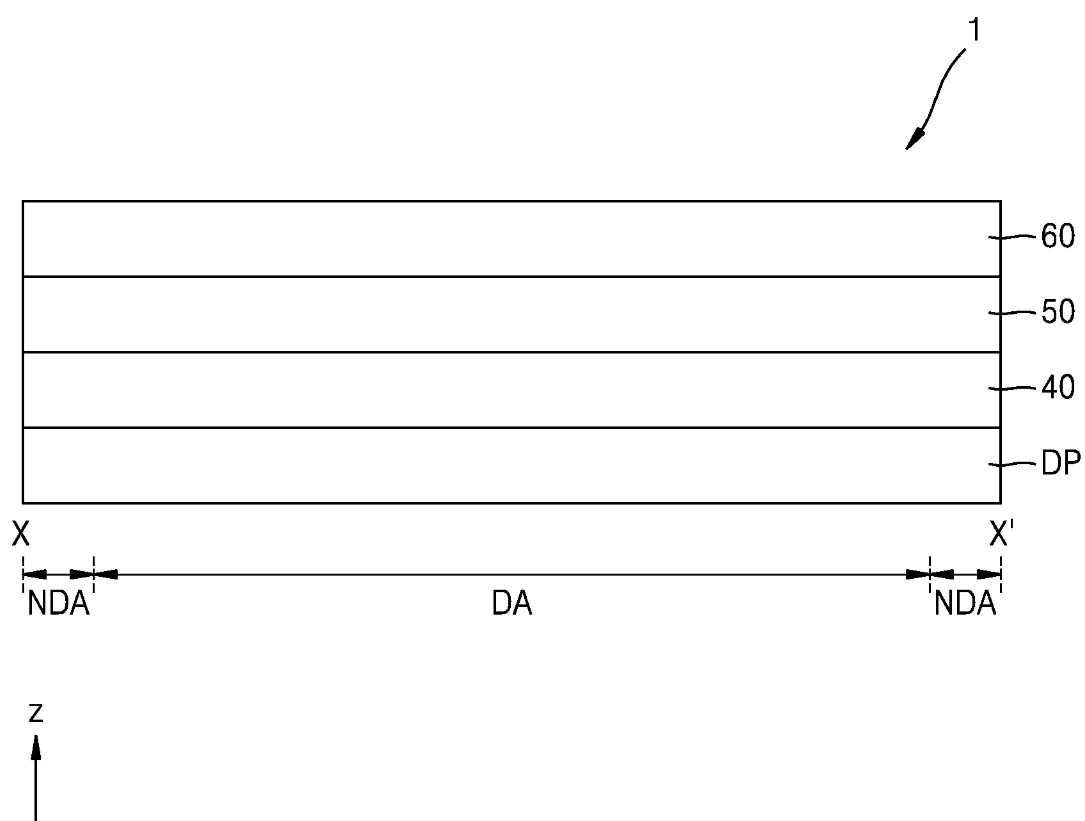
FIG. 2 is a cross-sectional view schematically illustrating the display apparatus taken along the line X-X' of FIG. 1.

FIG. 2 is a cross-sectional view schematically illustrating a cross-section of the display apparatus 1 taken along the line X-X' of FIG. 1.

Referring to FIG. 2, the display apparatus 1 may include a display panel DP, an input sensing layer 40 disposed on the display panel DP, and an optical functional layer 50. The display panel DP, the input sensing layer 40, and the optical functional layer 50 may be covered by a window 60.

An image may be displayed on the display panel DP. The display panel DP may include the pixels P in the display area DA.

The input sensing layer 40 may obtain coordinate information according to an external input, such as a touch event. The input sensing layer 40 may include a sensing electrode (or a touch electrode), and trace lines connected to the sensing electrode. The input sensing layer 40 may be disposed on the display panel DP. The input sensing layer 40 may detect an external input by using a mutual capacitance method and/or a self-capacitance method.

The input sensing layer 40 may be directly formed on the display panel DP, or may be separately formed and then connected to (e.g., attached to or bonded to) the display panel DP through an adhesive layer, such as an optical clear adhesive. For example, the input sensing layer 40 may be formed continuously after a process of forming the display panel DP. In this case, the input sensing layer 40 may be understood as a portion of the display panel DP, and an adhesive layer may not be disposed between the input sensing layer 40 and the display panel DP. In FIG. 2, the input sensing layer 40 is located between the display panel DP and the optical functional layer 50. However, in another embodiment, the input sensing layer 40 may be disposed above the optical functional layer 50.

The optical functional layer 50 may include an anti-reflection layer. The anti-reflection layer may reduce a reflectivity of light (e.g., external light) incident toward the display panel DP from the outside through the window 60. In an embodiment, the anti-reflection layer may include a black matrix and color filters. The color filters may be arranged in consideration of the color of light emitted from each of the pixels P of the display panel DP.

In another embodiment, the anti-reflection layer may include a retarder and a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretchable synthetic resin film, and the liquid crystal coating type may include liquid crystals arranged in an array. Each of the retarder and the polarizer may further include a protective film. The retarder and the polarizer themselves or the protective film may be defined as a base layer of the anti-reflection layer.

In another embodiment, the anti-reflection layer may include a destructive interference structure. The destructive interference structure may include a first reflective layer and a second reflective layer at (e.g., in or on) different layers from each other. First reflected light and second reflected light reflected by the first reflective layer and the second reflective layer, respectively, may destructively interfere with each other, and thus, reflectivity of external light may decrease.

In an embodiment, the optical functional layer 50 may be formed continuously after a process of forming the display panel DP and/or the input sensing layer 40. In this case, an adhesive layer may not be disposed between the optical functional layer 50 and the display panel DP and/or the input sensing layer 40.

In some embodiments, a layer including an optical clear adhesive or an optical clear resin may be further located between the window 60 and the optical functional layer 50.

Figure 3:
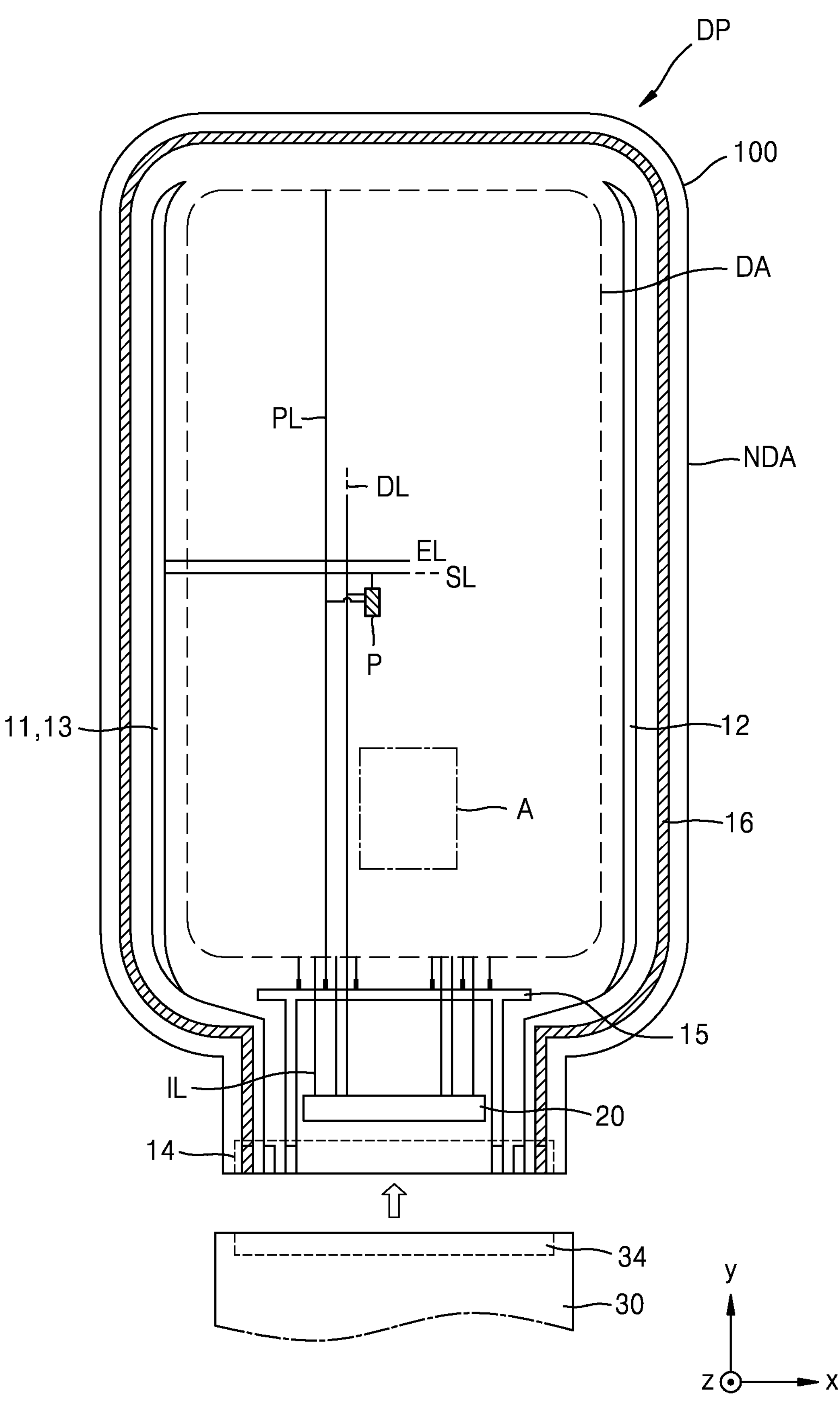
FIG. 3 is a plan view schematically illustrating a display panel included in a display apparatus according to an embodiment.

FIG. 3 is a plan view schematically illustrating a display panel included in a display apparatus according to an embodiment.

The display apparatus according to an embodiment may include the display panel DP. FIG. 3 may be understood as illustrating a shape of the substrate 100 of the display panel DP.

Referring to FIG. 3, the display panel DP may include a display area DA, and a non-display area NDA outside the display area DA. The display area DA is a portion for displaying an image, and may have a plurality of display elements arranged therein. In FIG. 2, the display area DA has an approximately rectangular shape with rounded edges (or rounded corners). However, the present disclosure is not limited thereto. As described above, the display area DA may be, for example, an N-sided polygon (where N is a natural number greater than or equal to 3), or may have various suitable shapes, such as a circle or an ellipse.

Each of the pixels P may refer to a sub-pixel. The pixel P may be defined as an area in which a display element emits light. The display element may include an organic light-emitting diode or a quantum dot organic light-emitting diode. For example, each of the pixels P may emit red, green, blue, or white light.

The non-display area NDA may be arranged outside the display area DA. Outer circuits for driving the display element may be arranged in the non-display area NDA. For example, a first scan driving circuit 11, a second scan driving circuit 12, an emission control driving circuit 13, a terminal 14, a driving power supply line 15, and a common power supply line 16 may be arranged in the non-display area NDA.

The first scan driving circuit 11 may provide a scan signal to the display element included in the pixel P via a scan line SL. The second scan driving circuit 12 may be arranged to be parallel to the first scan driving circuit 11 with the display area DA therebetween. Display elements included in some of the pixels P arranged in the display area DA may be electrically connected to the first scan driving circuit 11, and the other display elements may be connected to the second scan driving circuit 12. When necessary or desired, the second scan driving circuit 12 may be omitted, and the display elements of all of the pixels P arranged in the display area DA may all be electrically connected to the first scan driving circuit 11.

The emission control driving circuit 13 may be arranged on a side of the first scan driving circuit 11, and may provide an emission control signal to the display element of the pixel P via an emission control line EL. In FIG. 3, the emission control driving circuit 13 is illustrated as being arranged only at one side of the display area DA. However, the emission control driving circuit 13 may be arranged at opposite sides of the display area DA, similar to that of the first scan driving circuit 11 and the second scan driving circuit 12.

In an embodiment, the non-display area NDA may include a bending area extending from one side of the display area DA (in a-y direction). The bending area may be bent toward a rear surface of the display area DA, and the non-display area NDA may be reduced when viewed from a front surface of the display apparatus.

A driving chip 20 may be arranged in the non-display area NDA. The driving chip 20 may include an integrated circuit to drive the display panel DP. The integrated circuit may be a data driving integrated circuit to generate a data signal, but the present disclosure is not limited thereto.

The terminal 14 may be arranged in the non-display area NDA. The terminal 14 may be exposed without being covered by an insulating layer, and may be electrically connected to a printed circuit board 30. A terminal 34 of the printed circuit board 30 may be electrically connected to the terminal 14 of the display panel DP.

The printed circuit board 30 may transfer a signal or power of a controller to the display panel DP. A control signal generated by the controller may be transferred to each of the driving circuits via the printed circuit board 30. In addition, the controller may transfer a driving voltage ELVDD to the driving power supply line 15, and may provide a common voltage ELVSS to the common power supply line 16. The driving voltage ELVDD may be transferred to a display element of each of the pixels P via a driving voltage line PL connected to the driving power supply line 15, and the common voltage ELVSS may be transferred to an opposite electrode included in the display element of the pixel P. The driving power supply line 15 may have a shape extending in one direction (e.g., an x direction) from a lower side of the display area DA. The common power supply line 16 may have a loop shape with one side open, and may partially surround (e.g., around a periphery of) the display area DA.

The controller may generate a data signal, and the generated data signal may be transmitted to an input line IL via the driving chip 20, and then transmitted to the display element of the pixel P via a data line DL connected to the input line IL. The term "line" may refer to "a wire." This is also the same for the embodiments described in more detail below and the modifications thereof.

Figure 4A:
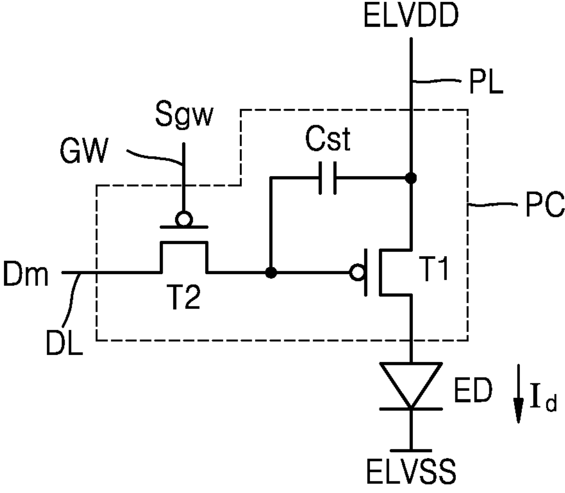
FIGS. 4A and 4B are equivalent circuit diagrams schematically illustrating a display element included in a display apparatus according to one or more embodiments.
Figure 4B:
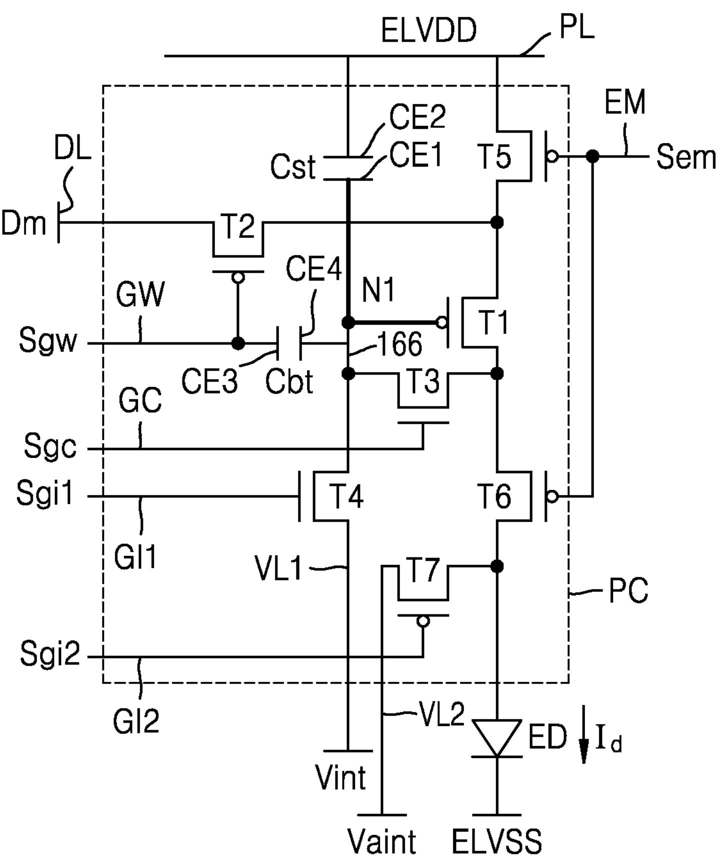

FIGS. 4A and 4B are equivalent circuit diagrams schematically illustrating a display element included in a display apparatus according to one or more embodiments.

Referring to FIG. 4A, a light-emitting diode ED, which is a display element, may be electrically connected to a pixel circuit PC. The pixel circuit PC may include a first transistor T1, a second transistor T2, and a storage capacitor Cst.

The second transistor T2 may transmit a data signal Dm received via the data line DL to the first transistor T1 according to a scan signal Sgw received via a scan line GW.

The storage capacitor Cst may be connected to the second transistor T2 and the driving voltage line PL, and may store a voltage corresponding to a voltage difference between a voltage received from the second transistor T2 and the driving voltage ELVDD applied to the driving voltage line PL.

The first transistor T1 may be connected to the driving power line PL and the storage capacitor Cst, and may provide a driving current $I_d$ flowing through the light-emitting diode ED from the driving voltage line PL to correspond to a voltage value stored in the storage capacitor Cst. An opposite electrode (e.g., a cathode) of the light-emitting diode ED may receive the common voltage ELVSS. The light-emitting diode ED may emit light having a desired luminance according to the driving current $I_d$.

In FIG. 4A, the pixel circuit PC is illustrated as including two transistors and one storage capacitor. However, the present disclosure is not limited thereto. For example, referring to FIG. 4B, the pixel circuit PC according to an embodiment may include seven transistors and two capacitors.

Figure 5:
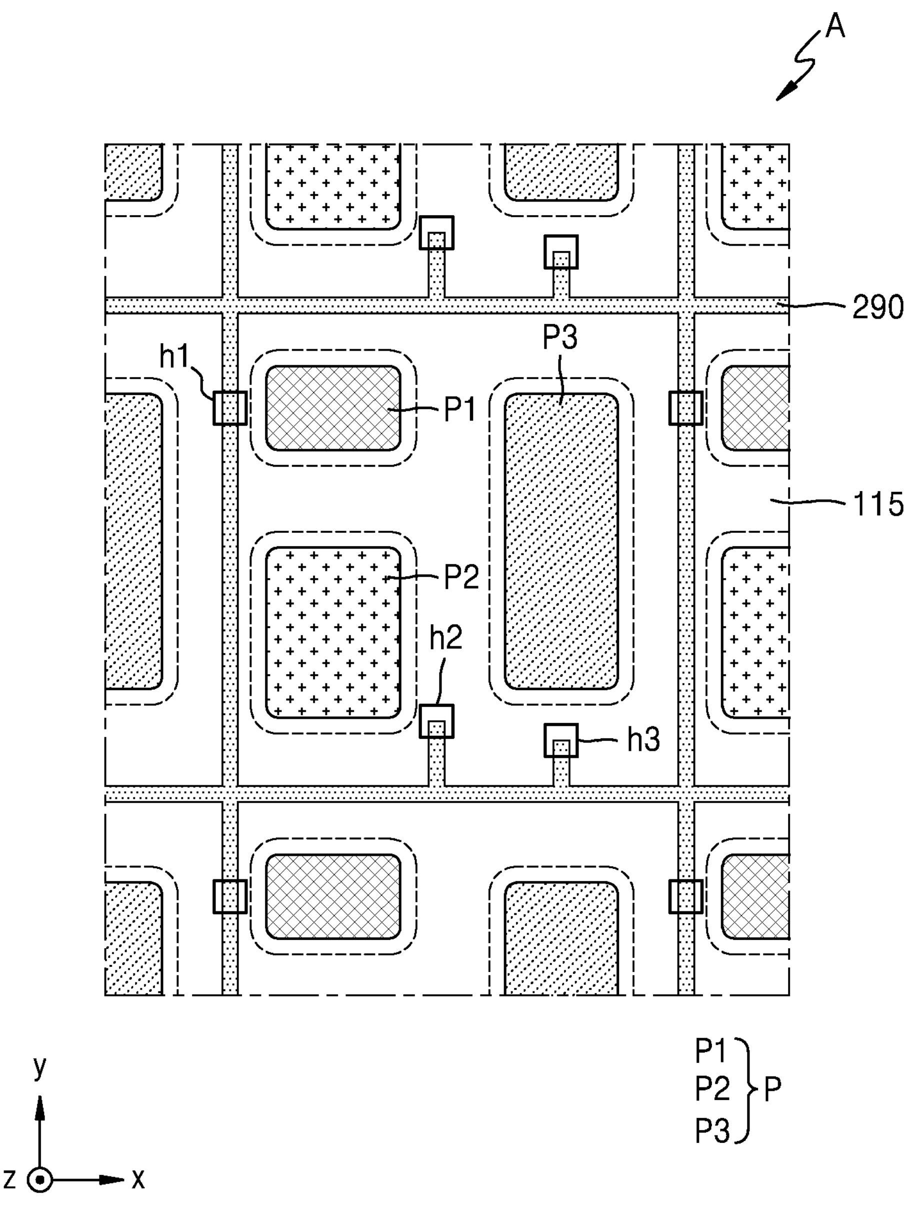
FIG. 5 is an enlarged plan view schematically illustrating the region A of the display apparatus of FIG. 1.
Figure 6:
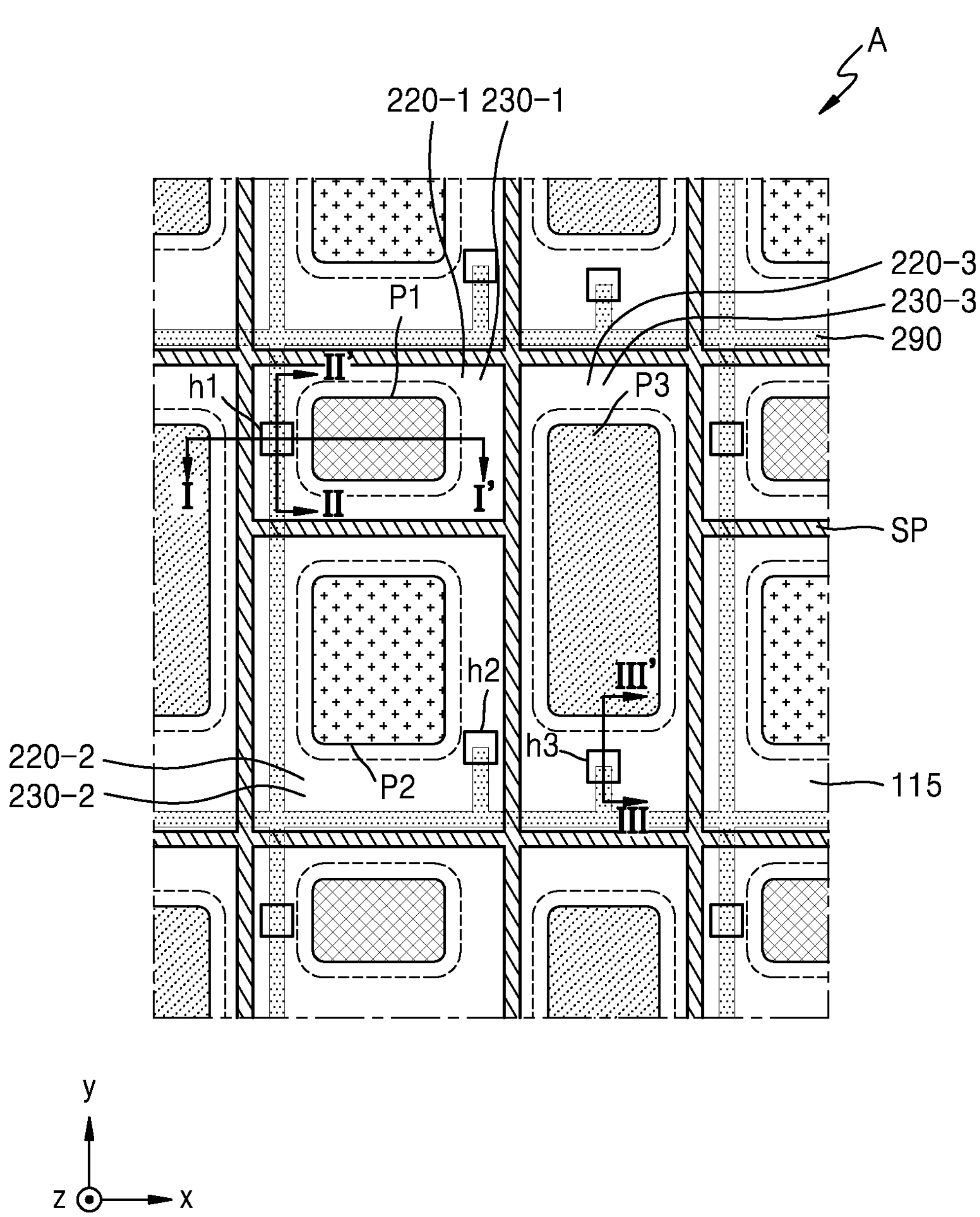
FIG. 6 is an enlarged plan view schematically illustrating the region A of the display apparatus of FIG. 1.
Figure 7:
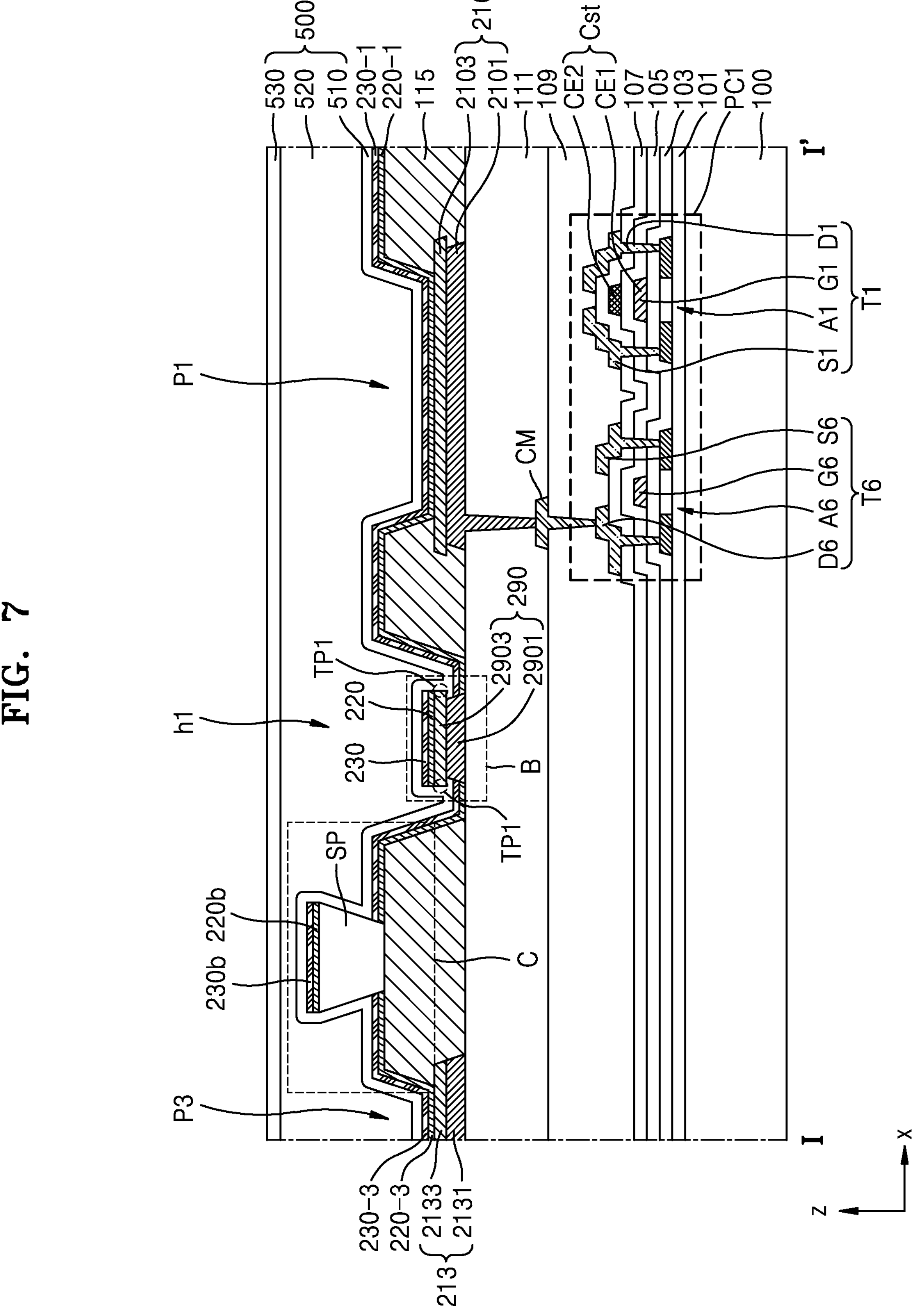
FIG. 7 is a cross-sectional view schematically illustrating the display apparatus taken along the line I-I' of FIG. 6 according to an embodiment.

FIGS. 5 and 6 are enlarged plan views schematically illustrating the region A of the display apparatus 1 of FIG. 1. FIG. 7 is a cross-sectional view schematically illustrating the display apparatus 1 taken along the line I-I' of FIG. 6 according to an embodiment.

First, referring to FIG. 7, a first pixel circuit PC1 may be disposed on the substrate 100. The substrate 100 may include a glass material or a polymer resin. The substrate 100 may include a structure in which a base layer, which includes a polymer resin, and an inorganic barrier layer are stacked.

The polymer resin may include (e.g., may be) polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate.

The barrier layer may include an inorganic material, such as silicon nitride ($SiN_x$) and/or silicon oxide ($SiO_x$).

A buffer layer 101 may be disposed on the substrate 100. The buffer layer 101 may prevent or substantially prevent the permeation of impurities into a semiconductor layer of a transistor. The buffer layer 101 may include an inorganic insulating material, such as silicon nitride, silicon oxynitride, and/or silicon oxide, and may be a single layer or multiple layers including one or more of the inorganic insulating materials described above.

The first pixel circuit PC1 may be disposed on the buffer layer 101. The first pixel circuit PC1 may include a plurality of transistors and a storage capacitor, similarly to that described above with reference to FIGS. 4A and 4B. In an embodiment, FIG. 7 shows a first transistor T1, a sixth transistor T6, and a storage capacitor Cst of the first pixel circuit PC1, for example, when the first pixel circuit PC1 includes seven transistors and two capacitors as described above with reference to FIG. 4B. The first transistor T1 may include a first semiconductor layer A1 on the buffer layer 101, and a first gate electrode overlapping with a channel region of the first semiconductor layer A1. The first semiconductor layer A1 may include a silicon-based semiconductor material, such as polysilicon. The first semiconductor layer A1 may include the channel region, a first region, and a second region. The first region and the second region being arranged at opposite sides of the channel region. The first region and the second region may be areas including impurities of a higher concentration than that of the channel region. One of the first region and the second region may correspond to a source region, and the other one may correspond to a drain region.

The sixth transistor T6 may include a sixth semiconductor layer A6 on the buffer layer 101, and a sixth gate electrode G6 overlapping with a channel region of the sixth semiconductor layer A6. The sixth semiconductor layer A6 may include a silicon-based semiconductor material, such as polysilicon. The sixth semiconductor layer A6 may include the channel region, a first region, and a second region. The first region and the second region may be arranged at opposite sides of the channel region. The first region and the second region may be areas including impurities of a higher concentration than that of the channel region. One of the first region and the second region may correspond to a source region, and the other one may correspond to a drain region.

Each of the first gate electrode G1 and the sixth gate electrode G6 may include a conductive material, including molybdenum (Mo), aluminum (Al), copper (Cu), titanium (Ti), and/or the like, and may include a single-layer or multi-layered structure including one or more of the materials described above. A first gate insulating layer 103 for electrical insulation from the first semiconductor layer A1 and the sixth semiconductor layer A6 may be disposed under the first gate electrode G1 and the sixth gate electrode G6. The first gate insulating layer 103 may include an inorganic insulating material, such as silicon nitride, silicon oxynitride, and/or silicon oxide, and may be a single layer or multiple layers including one or more of the inorganic insulating materials described above.

The storage capacitor Cst may include a lower electrode CE1 and an upper electrode CE2 overlapping with each other. In an embodiment, the lower electrode CE1 of the storage capacitor Cst may include the first gate electrode G1. In other words, the first gate electrode GE1 may include the lower electrode CE1 of the storage capacitor Cst. For example, the first gate electrode G1 and the lower electrode CE1 of the storage capacitor Cst may be integrally provided as a single body.

A first interlayer insulating layer 105 may be arranged between the lower electrode CE1 and the upper electrode CE2 of the storage capacitor Cst. The first interlayer insulating layer 105 may include an inorganic insulating layer, such as silicon oxide, silicon nitride, and/or silicon oxynitride, and may include a single-layer or multi-layered structure including one or more of the inorganic insulating materials described above.

The upper electrode CE2 of the storage capacitor Cst may include a low-resistance conductive material, such as Mo, Al, Cu, and/or Ti, and may include a single-layer or multi-layered structure including one or more of the materials described above.

A second interlayer insulating layer 107 may be disposed on the storage capacitor Cst. The second interlayer insulating layer 107 may include an inorganic insulating material, such as silicon oxide, silicon nitride, and/or silicon oxynitride, and may include a single-layer or multi-layered structure including one or more of the inorganic insulating materials described above.

A source electrode S1 and/or a drain electrode D1 electrically connected to the first semiconductor layer A1 of the first transistor T1 may be disposed on the second interlayer insulating layer 107. A source electrode S6 and/or a drain electrode D6 electrically connected to the sixth semiconductor layer A6 of the sixth transistor T6 may be disposed on the second interlayer insulating layer 107. The source electrodes S1 and S6 and/or the drain electrodes D1 and D6 may be located at (e.g., in or on) the same layer as that of the data line DL, and may include the same material as that of the data line DL. The source electrodes S1 and S6 and/or the drain electrodes D1 and D6 may include a conductive material, including Mo, Al, Cu, and/or Ti, and may include a single layer or multiple layers including one or more of the materials described above. In an embodiment, each of the source electrodes S1 and S6, the drain electrodes D1 and D6, and the data line DL may include a multi-layered structure of Ti/Al/Ti.

A first planarization layer 109 may be disposed on the first pixel circuit PC1. The first planarization layer 109 may include an organic insulating material, such as one or more general purpose polymers (e.g., poly(methyl methacrylate) (PMMA) or polystyrene (PS)), polymer derivatives having a phenol-based group, acryl-based polymers, imide-based polymers, aryl ether-based polymers, amide-based polymers, fluorine-based polymers, p-xylene-based polymers, vinyl alcohol-based polymers, and/or a suitable blend thereof.

A connection metal CM may be disposed on the first planarization layer 109. The connection metal CM may include Mo, Al, Cu, and/or Ti, and may include a single layer or multiple layers including one or more of the materials described above.

A second planarization layer 111 may be arranged between the connection metal CM and a first pixel electrode 210. The second planarization layer 111 may include an organic insulating material, such as one or more general purpose polymers (e.g., PMMA or PS), polymer derivatives having a phenol-based group, acryl-based polymers, imide-based polymers, aryl ether-based polymers, amide-based polymers, fluorine-based polymers, p-xylene-based polymers, vinyl alcohol-based polymers, and/or a suitable blend thereof. In an embodiment, each of the first planarization layer 109 and the second planarization layer 111 may include polyimide.

A first pixel P1 may include the first pixel electrode 210, a second pixel P2 may include a second pixel electrode, and a third pixel P3 may include a third pixel electrode 213. In this case, the first pixel electrode 210, the third pixel electrode 213, and a bus line 290 may be disposed on the second planarization layer 111. Because the second pixel electrode, the third pixel electrode 213, and the first pixel electrode 210 may include the same material as each other and may be concurrently or substantially simultaneously formed in the same process as each other, the first pixel electrode 210 is mainly described in more detail below.

The first pixel electrode 210 may be formed to be a (semi-)transparent electrode, or may be formed to be a reflective electrode. When the first pixel electrode 210 is formed as the (semi-)transparent electrode, the first pixel electrode 210 may include (e.g., may be formed with), for example, indium tin oxide (ITO), indium zinc oxide (IZO), zinc oxide (ZnO), indium oxide ($In_2O_3$), indium gallium oxide (IGO), or aluminum zinc oxide (AZO). When the first pixel electrode 210 is formed as the reflective electrode, a reflective film may be formed of silver (Ag), magnesium (Mg), Al, platinum (Pt), palladium (Pd), gold (Au), nickel (Ni), neodymium (Nd), iridium (Ir), chrome (Cr), Mo, Ti, or a suitable compound thereof, and a film including ITO, IZO, ZnO, or $In_2O_3$ may be formed on the reflective film. The first pixel electrode 210 may be electrically connected to the connection metal CM via a contact hole of the second planarization layer 111.

According to the embodiment illustrated in FIG. 7, the first pixel circuit PC1 and the first pixel electrode 210 are electrically connected to each other via the connection metal CM. However, in another embodiment, the connection metal CM may be omitted, and a single planarization layer may be located between the first pixel circuit CP1 and the first pixel electrode 210. As another example, three or more planarization layers may be located between the first pixel circuit PC1 and the first pixel electrode 210, and the first pixel circuit PC1 and the first pixel electrode 210 may be electrically connected to each other via a plurality of connection metals.

The first pixel electrode 210 may include a (1-1)st sub-pixel electrode 2101, and a (1-2)nd sub-pixel electrode 2103 disposed on the (1-1)st sub-pixel electrode 2101. In an embodiment, the (1-1)st sub-pixel electrode 2101 may include a conductive material or a metal material. For example, the (1-1)st sub-pixel electrode 2101 may include Al or Mo. In an embodiment, the (1-1)st sub-pixel electrode 2101 may have a multi-layered structure in which Ti is disposed on Al.

In an embodiment, the (1-2)nd sub-pixel electrode 2103 may include a (semi-)transparent electrode. For example, the (1-2)nd sub-pixel electrode 2103 may include ITO, IZO, ZnO, $In_2O_3$, IGO, or AGO. In an embodiment, the (1-2)nd sub-pixel electrode 2103 may have a structure in which an ITO layer, an Ag layer, and an ITO layer are sequentially stacked.

The third pixel electrode 213 may be disposed on the second planarization layer 111. The third pixel electrode 213 may include a (3-1)th sub-pixel electrode 2131, and a (3-2)th sub-pixel electrode 2133 disposed on the (3-1)th sub-pixel electrode 2131. The (3-1)th sub-pixel electrode 2131 may include the same material and/or structure as those of the (1-1)st sub-pixel electrode 2101. The (3-2)th sub-pixel electrode 2133 may include the same material and/or structure as those of the (1-2)nd sub-pixel electrode 2103.

Referring to FIGS. 5 to 7, the plurality of pixels P may be arranged in the display area DA of the substrate 100. Each of the pixels P may be defined as an emission area of a display element, such as an organic light-emitting diode OLED. For example, the pixel P may emit green, red, or blue light. For example, the pixel P may include the first pixel P1 for emitting red light, the second pixel P2 for emitting green light, or the third pixel P3 for emitting blue light. Red light may be light of a wavelength band in a range of about 580 nm to about 780 nm. Green light may be light of a wavelength band in a range of about 495 nm to about 580 nm. Blue light may be light of a wavelength band in a range of about 400 nm to about 495 nm.

When viewed from a direction (e.g., the z-axis direction) perpendicular to or approximately perpendicular to the substrate 100 (e.g., in a plan view), each of the first pixel P1, the second pixel P2, and the third pixel P3 may have a polygonal shape. In FIGS. 5 and 6, each of the first pixel P1, the second pixel P2, and the third pixel P3 has a quadrangular shape, for example, such as a quadrangular shape with rounded corners, when viewed from the direction (e.g., the z-axis direction) perpendicular to or approximately perpendicular to the substrate 100 (e.g., in a plan view). However, the present disclosure is not limited thereto. For example, each of the first pixel P1, the second pixel P2, and the third pixel P3 may have a circular shape or an elliptical shape, when viewed from the direction (e.g., the z-axis direction) perpendicular to or approximately perpendicular to the substrate 100.

Sizes (e.g., areas) of the first pixel P1, the second pixel P2, and the third pixel P3 may be different from each other. For example, an area of the third pixel P3 may be greater than an area of the first pixel P1 or the second pixel P2. However, the present disclosure is not limited thereto. For example, the areas of the first pixel P1, the second pixel P2, and the third pixel P3 may be equal to or substantially equal to each other.

The first pixel P1, the second pixel P2, and the third pixel P3 may be arranged in an S-stripe manner, as shown in FIGS. 5 and 6. In this case, the first pixel P1 and the second pixel P2 may be alternately located with each other along the y-axis direction. A pair including the first pixel P1 and the second pixel P2 may be alternately located with the third pixel P3 along the x-axis direction.

However, the present disclosure is not limited thereto. In an embodiment, the first pixel P1, the second pixel P2, and the third pixel P3 may be arranged in an RGBG manner (e.g., a PENTILE® arrangement, PENTILE® being a duly registered trademark of Samsung Display Co., Ltd.). In other words, when a virtual quadrangle has its center at the first pixel P1, the second pixel P2 may be arranged at one vertex, and the third pixel P3 may be arranged at a vertex neighboring (e.g., adjacent to) the vertex at which the second pixel P2 is arranged. In addition, the second pixel P2 may be arranged at a vertex at a location symmetrical to the vertex at which the second pixel P2 is arranged, with respect to the center of the virtual quadrangle, and the third pixel P3 may be arranged at a vertex at a location symmetrical to the vertex at which the third pixel P3 is arranged, with respect to the center of the virtual quadrangle. In an embodiment, the first pixel P1, the second pixel P2, and the third pixel P3 may be arranged in a stripe manner. In this case, the first pixel P1, the second pixel P2, and the third pixel P3 may be sequentially arranged along the x-axis direction.

The bus line 290 may be disposed on the second planarization layer 111. In an embodiment, when viewed from the direction (e.g., the z-axis direction) perpendicular to or approximately perpendicular to the substrate 100 (e.g., in a plan view), the bus line 290 may have a mesh structure. In other words, the bus line 290 may have a structure in which a line extending in a first direction (e.g., the x-axis direction) between the first pixel P1 and the second pixel P2 and a line extending in a second direction (e.g., the y-axis direction) between the pair of the first pixel P1 and the second pixel P2 and the third pixel P3 cross each other without overlapping with the pixel P. In addition, the bus line 290 may additionally include a line extending toward the pixel P, in the mesh structure as described above. For example, the bus line 290 may include a line additionally extending in the second direction (e.g., the y-axis direction) toward the second pixel P2 from the line extending in the first direction (e.g., the x-axis direction), and a line additionally extending in the second direction (e.g., the y-axis direction) toward the third pixel P3. However, the present disclosure is not limited thereto. The bus line 290 may be arranged in any suitable manner as would be understood by those having ordinary skill in the art, as long as a voltage may be supplied to each of the pixels P.

The bus line 290 may be integrally provided as a single body. The bus line 290 may be formed in the same process in which the first pixel electrode 210 is formed.

The bus line 290 may extend from the display area DA to the non-display area NDA, and may be electrically connected to the common power supply line 16 (e.g., see FIG. 3). The bus line 290 may be in direct contact with the common power supply line 16, or may be connected to the common power supply line 16 via a conductive layer arranged between the bus line 290 and the common power supply line 16.

The pixel-defining layer 115 may be disposed on the second planarization layer 111. In this case, the first pixel electrode 210, the third pixel electrode 213, and the bus line 290 may be disposed between the second planarization layer 111 and the pixel-defining layer 115. The pixel-defining layer 115 may have an opening that exposes at least a portion of the first pixel electrode 210 and the third pixel electrode 213. In an embodiment, the pixel-defining layer 115 may have an opening corresponding to each display element, for example, such as an opening that exposes at least a central portion of each display element, to define a pixel. The pixel-defining layer 115 may cover a side surface of each of the first pixel electrode 210 and the third pixel electrode 213. In other words, when viewed from the direction (e.g., the z-axis direction) perpendicular to or approximately perpendicular to the substrate 100 (e.g., in a plan view), the pixel-defining layer 115 may overlap with an edge of each of the first pixel electrode 210 and the third pixel electrode 213.

The pixel-defining layer 115 may have a hole that exposes at least a portion of the bus line 290. The pixel-defining layer 115 may have a first hole h1 adjacent to the first pixel P1, a second hole h2 adjacent to the second pixel P2, and a third hole h3 adjacent to the third pixel P3, to expose a portion of the bus line 290.

The pixel-defining layer 115 may include an organic insulating material and/or an inorganic insulating material. In an embodiment, the pixel-defining layer 115 may include an inorganic insulating material, such as silicon oxide, silicon nitride, and/or silicon oxynitride. When the pixel-defining layer 115 includes an inorganic insulating material, a distance between the pixels P may be formed to be smaller. In an embodiment, the pixel-defining layer 115 may include one or more organic insulating materials selected from the group consisting of polyimide, polyamide, acrylic resin, benzocyclobutene (BCB), and a phenolic resin. In an embodiment, the pixel-defining layer 115 may include a multi-layered structure including one or more of the inorganic insulating materials and one or more of the organic insulating materials described above.

A separator SP may be disposed on the pixel-defining layer 115. The separator SP may reduce a leakage current by disconnecting a common layer and/or a charge generation layer described in more detail below. The separator SP may be arranged between the first pixel P1 and the second pixel P2, between the second pixel P2 and the third pixel P3, and/or between the third pixel P3 and the first pixel P1. When viewed from the direction (e.g., the z-axis direction) perpendicular to or approximately perpendicular to the substrate 100 (e.g., in a plan view), the separator SP may be arranged to surround (e.g., around a periphery of) each of the first pixel P1, the second pixel P2, and the third pixel P3. In an embodiment, when viewed from the direction (e.g., the z-axis direction) perpendicular to or approximately perpendicular to the substrate 100, the separator SP may be arranged to surround (e.g., around peripheries of) the first pixel P1 and the first hole h1 together, the second pixel P2 and the second hole h2 together, and/or the third pixel P3 and the third hole h3 together. However, the present disclosure is not limited thereto. The separator SP may be arranged in any suitable array, as long as a voltage may be applied to each of the pixels P through each corresponding hole, and concurrently or substantially simultaneously, the common layer and/or the charge generation layer to be described in more detail below are disconnected between each of the pixels P. The separator SP may be integrally provided as a single body. The first pixel P1 may include the first pixel electrode 210, the second pixel P2 may include the second pixel electrode, and the third pixel P3 may include the third pixel electrode 213. Accordingly, when viewed from the direction (e.g., the z-axis direction) perpendicular to or approximately perpendicular to the substrate 100, it may be understood that the separator SP may be arranged between the first pixel electrode 210 and the second pixel electrode, between the second pixel electrode and the third pixel electrode 213, and/or between the third pixel electrode 213 and the first pixel electrode 210, and may be arranged to surround (e.g., around peripheries of) the first pixel electrode 210 and the first hole h1 together, the second pixel electrode and the second hole h2 together, and/or the third pixel electrode 213 and the third hole h3 together.

Figure 16:
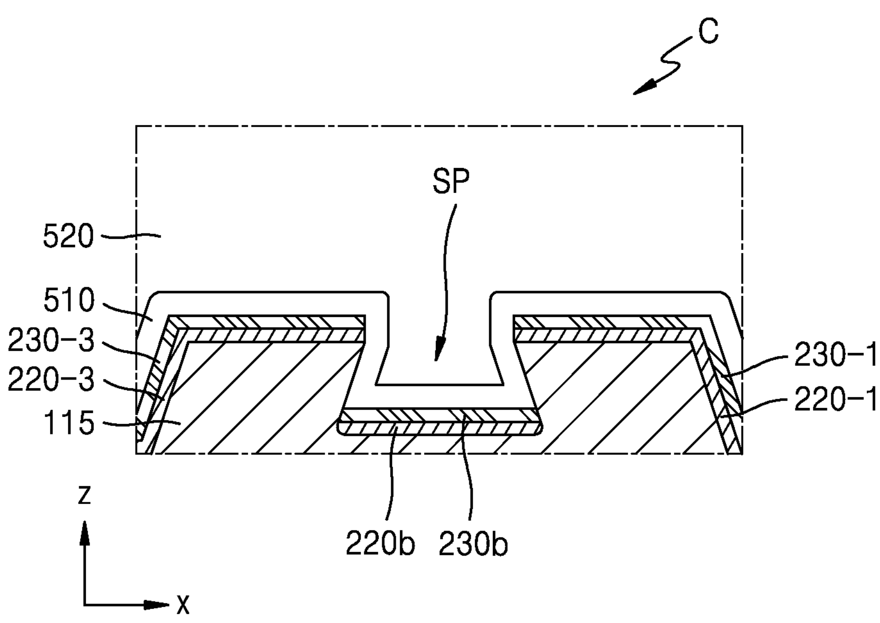
FIG. 16 is an enlarged cross-sectional view of the region C in FIG. 7 according to an embodiment.
Figure 17:
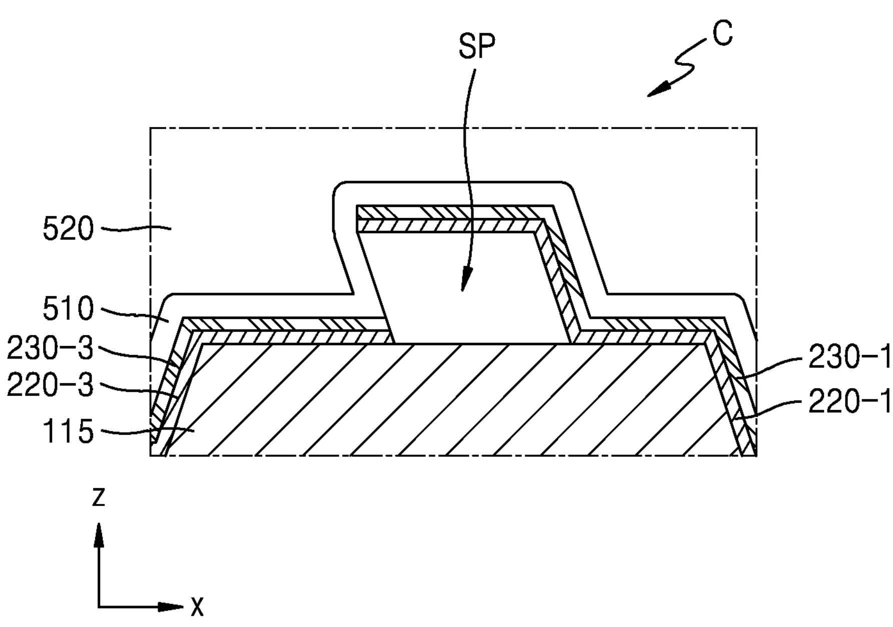
FIG. 17 is an enlarged cross-sectional view of the region C in FIG. 7 according to another embodiment.

As shown in FIG. 7, in some embodiments, the separator SP may be disposed on the pixel-defining layer 115 in a reverse tapered structure, in which a width of an upper portion of the separator SP is greater than a width of a lower portion of the separator SP. However, the present disclosure is not limited thereto. The separator SP may be formed in any suitable structure as would be understood by those having ordinary skill in the art, as long as the structure disconnects the common layer and/or the charge generation layer to be described in more detail below. For example, referring to FIG. 16, which is an enlarged cross-sectional view schematically illustrating the region C of FIG. 7 according to another embodiment, the pixel-defining layer 115 may include the separator SP. In this case, the separator SP may have a trench shape having a reverse tapered structure formed by removing or etching a portion of the pixel-defining layer 115, such that the width of the lower portion of the separator SP is greater than the width of the upper portion of the separator SP. Referring to FIG. 17, in another embodiment, the separator SP may be disposed on the pixel-defining layer 115, and one side of the separator SP may have a tapered shape in a reverse direction, and another side (e.g., an opposite side) of the separator may have a tapered shape in a forward direction.

Figure 12:
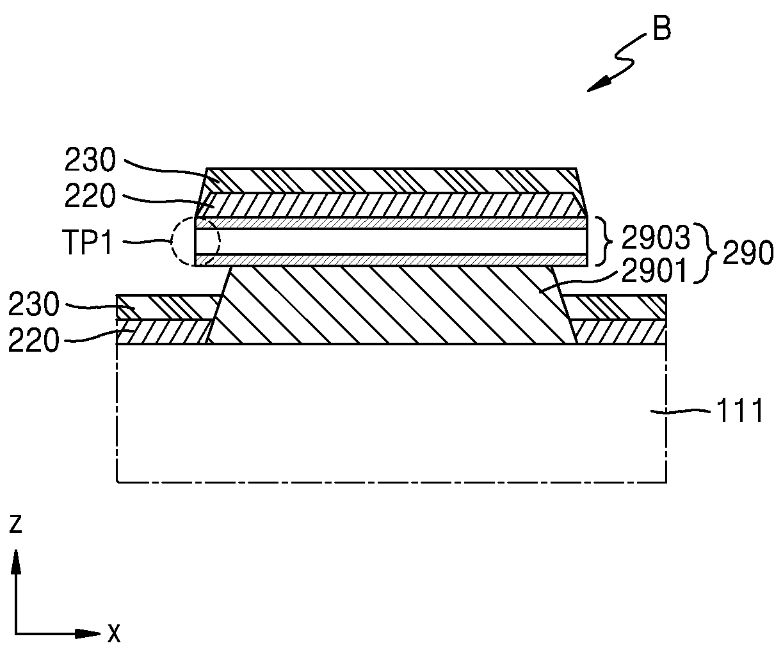
FIG. 12 is an enlarged cross-sectional view schematically illustrating the region B of FIG. 7.
Figure 13:
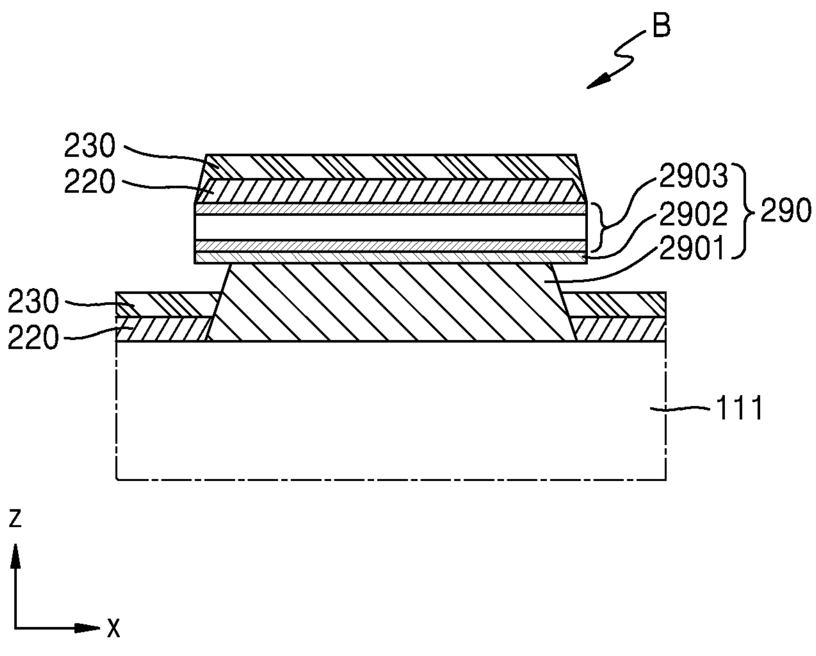
FIG. 13 is a cross-sectional view illustrating a modification of FIG. 12.

FIGS. 12 and 13 are enlarged cross-sectional views schematically illustrating the region B of FIG. 7. Referring to FIGS. 7, 12, and 13, in an embodiment, the bus line 290 may include a first line layer 2901, and a second line layer 2903 disposed on the first line layer 2901. The bus line 290 may have an undercut shape. In other words, a width of the first line layer 2901 may be less than a width of the second line layer 2903. The second line layer 2903 may have a first tip TP1 protruding more than an edge of the first line layer 2901. In other words, the second line layer 2903 may have the first tips TP1 protruding toward the first pixel P1 and the third pixel P3, respectively, on the first line layer 2901. Ends of the first tips TP1 protruding toward the first pixel P1 and the third pixel P3 may protrude to be closer to the first pixel P1 and the third pixel P3, respectively, than ends of the first line layer 2901 facing toward the first pixel P1 and the third pixel P3. In other words, the second line layer 2903 may have the first tips TP1 protruding toward the first pixel P1 and also protruding in an opposite direction from the first pixel P1. Because the first pixel P1 includes the first pixel electrode 210, it may be understood that the second line layer 2903 has the first tips TP1 protruding toward the first pixel electrode 210 and also protruding in an opposite direction from the first pixel electrode 210.

The first line layer 2901 may include a conductive material. In an embodiment, the first line layer 2901 may include a metal, such as Mo, Al, Cu, and/or Ti. The first line layer 2901 may include the same material as that of the (1-1)st sub-pixel electrode 2101 of the first pixel electrode 210, and may be concurrently or substantially simultaneously formed in the same process as that of the (1-1)st sub-pixel electrode 2101 of the first pixel electrode 210.

The second line layer 2903 may include a suitable material having a different etching selectivity from that of the first line layer 2901 during an etching process. The second line layer 2903 may include ITO, IZO, ZnO, $In_2O_3$, IGO, or AZO. In an embodiment, the second line layer 2903 may have a structure in which an ITO layer, an Ag layer, and another ITO layer are sequentially stacked. The second line layer 2903 may include the same material as that of the (1-2)nd sub-pixel electrode 2103 of the first pixel electrode 210, and may be concurrently or substantially simultaneously formed in the same process as that of the (1-2)nd sub-pixel electrode 2103 of the first pixel electrode 210.

Because the first line layer 2901 may be concurrently or substantially simultaneously formed in the same process as that of the (1-1)st sub-pixel electrode 2101 of the first pixel electrode 210, and the second line layer 2903 may be concurrently or substantially simultaneously formed in the same process as that of the (1-2)nd sub-pixel electrode 2103 of the first pixel electrode 210, the first pixel electrode 210 may also have the same or substantially the same structure as that of the bus line 290. In other words, the first pixel electrode 210 may have an undercut structure, and the (1-2)nd sub-pixel electrode 2103 of the first pixel electrode 210 may protrude more than an edge of the (1-1)st sub-pixel electrode 2101.

In another embodiment, as illustrated in FIG. 13, the bus line 290 may further include a third line layer 2902 between the first line layer 2901 and the second line layer 2903. A width of the third line layer 2902 may be greater than a width of the first line layer 2901. In other words, the third line layer 2902, which has the width greater than the width of the first line layer 2901, and the second line layer 2903 may be disposed on the first line layer 2901, and the bus line 290 may have a reverse tapered structure. The third line layer 2902 may include a different conductive material from a conductive material of the first line layer 2901. For example, the third line layer 2902 may include Ti.

Referring again to FIG. 7, the intermediate layer 220 may be disposed on the pixel-defining layer 115, the first pixel electrode 210, the bus line 290, and the third pixel electrode 213. The opposite electrode 230 may be disposed on the intermediate layer 220. The intermediate layer 220 may be electrically connected to the first pixel electrode 210 and/or the third pixel electrode 213. In an embodiment, the intermediate layer 220 may be in contact with the first pixel electrode 210 and the third pixel electrode 213. The opposite electrode 230 may be disposed on the intermediate layer 220. The first pixel electrode 210, the intermediate layer 220, and the opposite electrode 230 may be stacked to form a display element. In an embodiment, the display element may be the organic light-emitting diode OLED. The intermediate layer 220 may include an organic material including a fluorescent or phosphorescent material for emitting red, green, or blue light.

Figure 14:
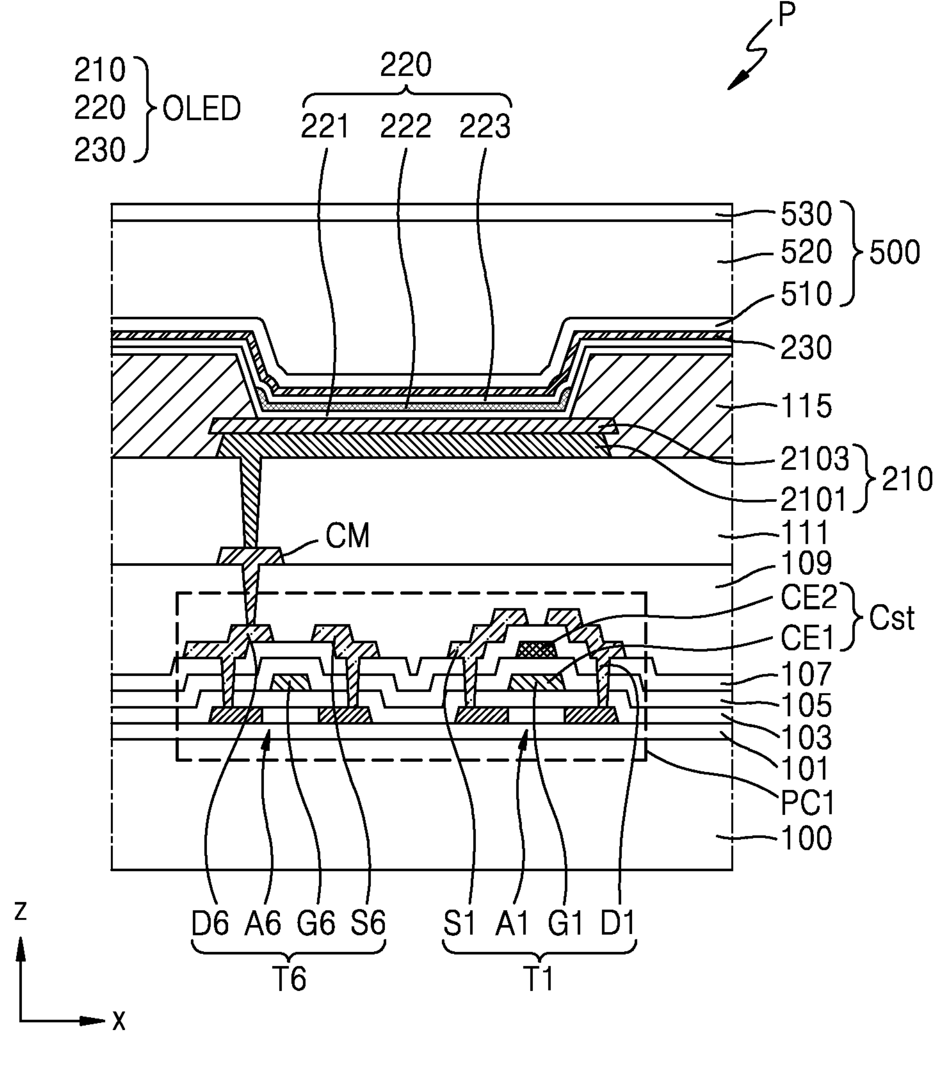
FIG. 14 is a cross-sectional view schematically illustrating a portion of a display apparatus according to an embodiment.
Figure 15:
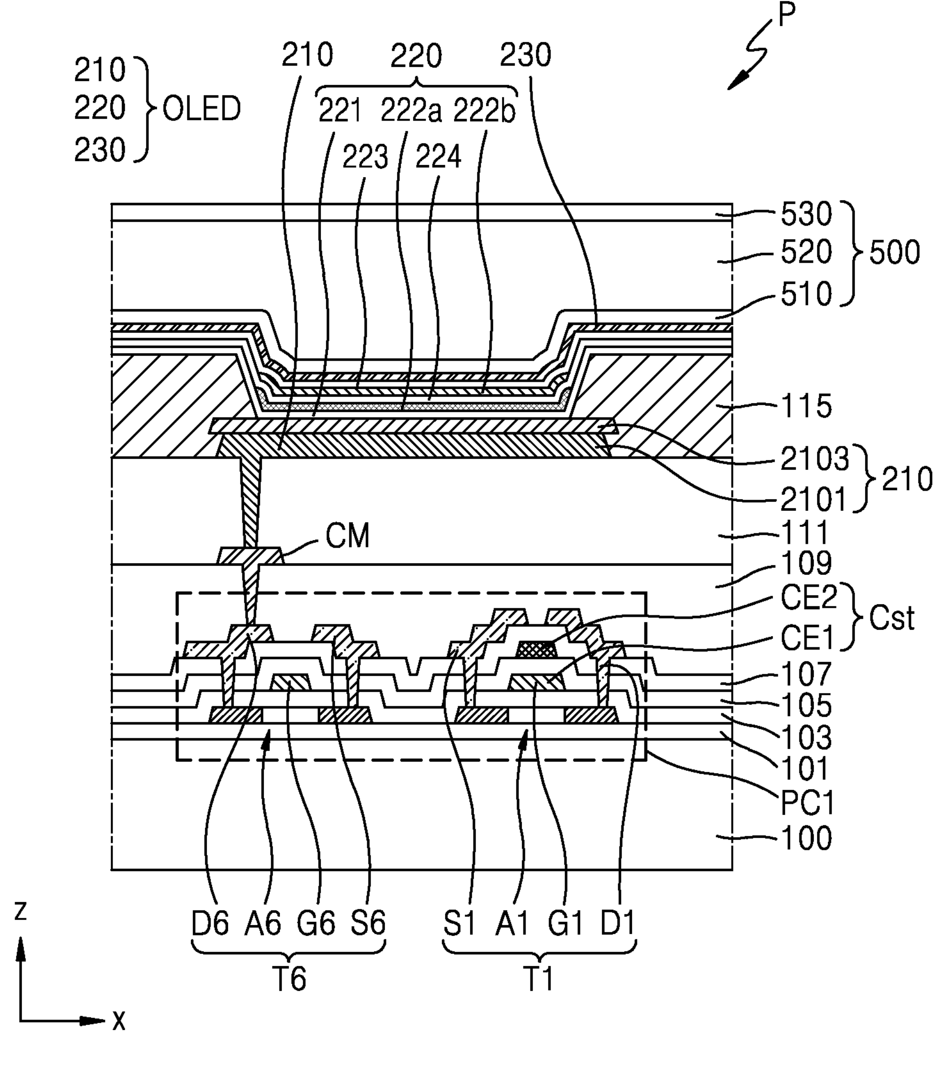
FIG. 15 is a cross-sectional view schematically illustrating a portion of a display apparatus according to an embodiment.

FIGS. 14 and 15 are cross-sectional views schematically illustrating a portion of a display apparatus according to one or more embodiments.

Referring to FIG. 14, in an embodiment, the intermediate layer 220 may include one emission layer 222 patterned to correspond to the pixel P. A first common layer 221 and a second common layer 223 may be included above/under the emission layer 222. For example, the first common layer 221 is located between the emission layer 222 and the first pixel electrode 210, and the second common layer 223 is provided between the emission layer 222 and the opposite electrode 230. The first common layer 221 and the second common layer 223 may each be integrally formed as a single body to entirely cover the display area DA. The first common layer 221 may include a hole injection layer (HIL) and/or a hole transport layer (HTL), and the second common layer 223 may include an electron transport layer (ETL) and/or an electron injection layer (EIL). In another embodiment, at least one of the HIL, the HTL, the ETL, or the EIL may be omitted as needed or desired.

The HIL may serve to facilitate the injection of holes, and may include one or more selected from the group consisting of hexaazatrinaphthylene (HATCN), copper phthalocyanine (CuPc), poly(3,4)-ethylenedioxythiophene (PEDOT), polyaniline (PANI), and N, N-dinaphthyl-N, N'-diphenylbenzidine (NPD), but the present disclosure is not limited thereto.

The HTL may include triphenylamine derivatives having high electron mobility and excellent stability, such as N, N'-diphenyl-N, N'-bis(3-methylphenyl)-1,1'-bi-phenyl-4,4'-diamine (TPD), or N,N'-di(naphthalene-1-yl)-N,N'-diphenyl-benzidine (NPB), as a host of the ETL.

The ETL may serve to facilitate the transport of electrons, and may include one or more selected from the group consisting of tris(8-hydroxyquionolino)aluminum) (Alq3), [2-(4-biphenylyl)-5-(4-tert-butylphenyl)-1,3,4-oxadiazole] (PBD), 3-(4-biphenylyl)-4-phenyl-5-(4-tert-butylphenyl)-1,2,4-triazole (TAZ), spiro-PBD, aluminum(III)bis(2-methyl-8-quinolinato)4-phenylphenolate (BAlq), lithium quinolate (Liq), (5,5'-bis(dimethylboryl)-2,2':5',2"-terthiophene (BMB-3T), perfluoro-2-naphthyl-substituted (PF-6P), tris (1-phenyl)-1H-benzimidazole (TPBI), cyclooctatetracene (COT), and bis(2-methyl-quinolinato)(triphenylsiloxy)aluminum(III) (SAlq). However, the present disclosure is not limited thereto.

The EIL may serve to facilitate the injection of electrons, and may include (e.g., may use) ytterbium (Yb), Alq3, PBD, TAZ, spiro-PBD, BAlq, or SAlq, but the present disclosure is not limited thereto.

In another embodiment, the intermediate layer 220 may include two emitting units (e.g., two emitting layers) sequentially stacked between the first pixel electrode 210 and the opposite electrode 230, and a charge generation layer (CGL) arranged between the two emitting units. The organic light-emitting diode OLED including such an intermediate layer 220 may be referred to as a tandem light-emitting element. Because the organic light-emitting diode OLED has a stacked structure of a plurality of emitting units (e.g., a plurality of emitting layers), color purity and emission efficiency of the display apparatus may be improved.

FIG. 15 shows a tandem light-emitting element. Referring to FIG. 15, the intermediate layer 220 may include a plurality of emission layers 222*a* and 222*b*. In other words, the intermediate layer 220 may include a lower emission layer 222*a* and an upper emission layer 222*b* arranged to overlap with each other. The lower emission layer 222*a* and the upper emission layer 222*b* may be patterned to correspond to the opening of the pixel-defining layer 115.

In an embodiment, the lower emission layer 222*a* and the upper emission layer 222*b* arranged to overlap with each other may emit light of the same or substantially the same wavelength as each other, or may emit light of different wavelengths from each other. For example, when the organic light-emitting diode OLED emits red light, the lower emission layer 222*a* may emit red light, and the upper emission layer 222*b* may also emit red light. As another example, the lower emission layer 222*a* may emit red light, and the upper emission layer 222*b* may emit blue light.

In an embodiment, a charge generation layer 224 may be arranged between the lower emission layer 222*a* and the upper emission layer 222*b*. The charge generation layer 224 may be a common layer formed across the entire surface of the display area DA. The charge generation layer 224 may supply charges to each of the first common layer 221, the lower emission layer 222*a*, the upper emission layer 222*b*, and the second common layer 223.

The charge generation layer 224 may include an n-type charge generation layer (n-CGL) for supplying electrons to the first common layer 221 and the lower emission layer 222*a*, and a p-type charge generation layer (p-CGL) for supplying holes to the upper emission layer 222*b* and the second common layer 223.

The n-CGL may include an n-type dopant material and an n-type host material. The n-type dopant material may include (e.g., may be) a metal of Groups 1 and 2 on the periodic table, an organic material capable of injecting electrons, or a suitable mixture thereof. For example, the n-type dopant material may be one of an alkaline metal and an alkaline earth metal. In other words, the n-CGL may include an organic layer doped with an alkaline metal, such as lithium (Li), sodium (Na), potassium (K), or cesium (Cs), or an alkaline earth metal, such as magnesium (Mg), strontium (Sr), barium (Ba), or radium (Ra), but the present disclosure is not limited thereto. The n-type host material may include a suitable material capable of transferring electrons, and may include, for example, one or more materials from among Alq3, Liq, PBD, TAZ, spiro-PBD, BAlq, SAlq, (2,2',2-(1,3,5-benzinetriyl)-tris(1-phenyl-1-H-benzimidazole) (TPBi), oxadiazole, triazole, phenanthroline, benzoxazole, and benzthiazole. However, the present disclosure is not limited thereto.

The p-CGL may include a p-type dopant material and a p-type host material. The p-type dopant material may include a metal oxide, an organic material, such as tetrafluoro-tetracyanoquinodimethane (F4-TCNQ), hexaazatriphenylene-hexacarbonitrile (HAT-CN), and/or hexaazatriphenylene, or a metal material, such as vanadium pentoxide (V2O5), molybdenum oxide (MoOx), and/or tungsten trioxide (WO3), but the present disclosure is not limited thereto. The p-type host material may include a suitable material capable of transferring electrons, for example, such as a material including one or more of NPD, TPD, and 4,4',4-Tris(N-3-methylphenyl-N-phenyl-amino)-triphenylamine (MTDATA), but the present disclosure is not limited thereto.

The opposite electrode 230 may include a conductive material having a low work function. For example, the opposite electrode 230 may include a (semi-) transparent layer including Ag, Mg, Al, Pt, Pd, Au, Ni, Nd, Ir, Cr, Li, Ca, or a suitable alloy thereof. As another example, the opposite electrode 230 may further include a layer, such as ITO, IZO, ZnO, or $In_2O_3$, on the (semi-)transparent layer including one or more of the materials described above.

Referring again to FIGS. 6 and 7, the intermediate layer 220 and the opposite electrode 230 may be entirely formed on the substrate 100. In this case, when the intermediate layer 220 is entirely formed, from among a plurality of layers included in the intermediate layer 220, the first common layer, the second common layer 223, and the charge generation layer 224, except for the emission layer 222 patterned to correspond to the pixel P, may be entirely formed on the substrate 100.

As described above, when viewed from the direction (e.g., the z-axis direction) perpendicular to or approximately perpendicular to the substrate 100 (e.g., in a plan view), the separator SP may be arranged to surround (e.g., around peripheries of) the first pixel P1 and the first hole h1 together, the second pixel P2 and the second hole h2 together, and/or the third pixel P3 and the third hole h3 together, and thus, the intermediate layer 220 and the opposite electrode 230 may be disconnected by the separator SP. A first intermediate layer 220-1 may be disconnected from a second intermediate layer 220-2 and a third intermediate layer 220-3 by the separator SP. The first intermediate layer 220-1 may be disposed on the first pixel electrode 210 of the first pixel P1, the second intermediate layer 220-2 may be disposed on the second pixel electrode of the second pixel P2, and the third intermediate layer 220-3 may be disposed on the third pixel electrode 213 of the third pixel P3.

A first opposite electrode 230-1 may be disconnected from a second opposite electrode 230-2 and a third opposite electrode 230-3 by the separator SP. The first opposite electrode 230-1 may be disposed on the first pixel electrode 210 of the first pixel P1 and the first intermediate layer 220-1, the second opposite electrode 230-2 may be disposed on the second pixel electrode of the second pixel P2 and the second intermediate layer 220-2, and the third opposite electrode 230-3 may be disposed on the third pixel electrode 213 of the third pixel P3 and the third intermediate layer 220-3.

Accordingly, when viewed from the direction (e.g., the z-axis direction) perpendicular to or approximately perpendicular to the substrate 100 (e.g., in a plan view), the first intermediate layer 220-1, the second intermediate layer 220-2, and the third intermediate layer 220-3 may be arranged to be spaced apart from each other. When viewed from the direction (e.g., the z-axis direction) perpendicular to or approximately perpendicular to the substrate 100, the first opposite electrode 230-1, the second opposite electrode 230-2, and the third opposite electrode 230-3 may also be arranged to be spaced apart from each other.

The first opposite electrode 230-1 may be electrically connected to the bus line 290. For example, the first opposite electrode 230-1 may be electrically connected to at least one of the first line layer 2901 or the second line layer 2903. Because side surfaces of the first line layer 2901 and the second line layer 2903 of the bus line 290 are exposed through the first hole h1 of the pixel-defining layer 115, and the first intermediate layer 220-1 around the first tip TP1 of the second line layer 2903 is disconnected by the first tip TP1, the first opposite electrode 230-1 may be in contact with the side surface of the first line layer 2901 or the side surface of the second line layer 2903. The bus line 290 may transfer a common voltage to the first opposite electrode 230-1 through such electrical connection.

Each of the second opposite electrode 230-2 and the third opposite electrode 230-3 may also have a similar structure as that of the first opposite electrode 230-1. In other words, each of the second opposite electrode 230-2 and the third opposite electrode 230-3 may also be in contact with the side surface of the first line layer 2901 or the side surface of the second line layer 2903.

A dummy intermediate layer 220*b* and a dummy opposite electrode 230*b* may be formed on the separator SP. The first intermediate layer 220-1, the third intermediate layer 220-3, and the dummy intermediate layer 220*b* may include the same material as each other, and may be concurrently or substantially simultaneously formed in the same process as each other. The first opposite electrode 230-1, the third opposite electrode 230-3, and the dummy opposite electrode 230*b* may include the same material as each other, and may be concurrently or substantially simultaneously formed in the same process as each other. The intermediate layer 220 and the opposite electrode 230 may be entirely formed on the substrate 100. Accordingly, the dummy intermediate layer 220*b* may be a layer stacked on the separator SP in a process of forming the intermediate layer 220. Similarly, the dummy opposite electrode 230*b* may be a layer stacked on the separator SP in the process of forming the opposite electrode 230. By the separator SP, the dummy intermediate layer 220*b* and the intermediate layer 220 may be disconnected from each other, and the dummy opposite electrode 230*b* and the opposite electrode 230 may be disconnected from each other. Accordingly, by the separator SP, the first intermediate layer 220-1 and the third intermediate layer 220-3 may be disconnected from each other, and the first opposite electrode 230-1 and the third opposite electrode 230-3 may be disconnected from each other. In addition, the dummy intermediate layer 220*b* and the intermediate layer 220 may not be electrically connected to each other. In addition, the dummy opposite electrode 230*b* and the opposite electrode 230 may not be electrically connected to each other.

Referring to the cross-sectional view of FIG. 17 schematically illustrating the enlarged region C of FIG. 7 according to another embodiment, the dummy intermediate layer 220*b* and the dummy opposite electrode 230*b* may not be formed on the separator SP. In this case, around a reverse tapered side surface of the separator SP, the first intermediate layer 220-1 and the third intermediate layer 220-3 may be disconnected from each other, and the first opposite electrode 230-1 and the third opposite electrode 230-3 may be disconnected from each other.

When viewed from the direction (e.g., the z-axis direction) perpendicular to or approximately perpendicular to the substrate 100 (e.g., in a plan view), the separator SP may be arranged to surround (e.g., around peripheries of) the first pixel P1, the second pixel P2, and the third pixel P3. Accordingly, by the separator SP, the first intermediate layer 220-1 and the first opposite electrode 230-1, which overlap with the first pixel P1, may be respectively disconnected from the second intermediate layer 220-2 and the second opposite electrode, which overlap with the second pixel P2, and may be respectively disconnected from the third intermediate layer 220-3 and the third opposite electrode 230-3, which overlap with the third pixel P3. Through such a structure, a leakage current may be blocked, minimized, or reduced.

In the opposite electrode 230, the first opposite electrode 230-1, the second opposite electrode 230-2, and the third opposite electrode 230-3 are disconnected from each other by the separator SP surrounding (e.g., around a periphery of) each of the pixels P, but the opposite electrode 230 may be electrically connected to the bus line 290. In other words, the first opposite electrode 230-1, the second opposite electrode 230-2, and the third opposite electrode 230-3 may be electrically connected to each other by the bus line 290. Accordingly, as shown in FIG. 7, the first opposite electrode 230-1 may transfer a common voltage to the first pixel electrode 210.

An encapsulation layer 500 may be disposed on the light-emitting diode ED. The encapsulation layer 500 may include at least one inorganic encapsulation layer, and at least one organic encapsulation layer. In FIG. 7, the encapsulation layer 500 includes a first inorganic encapsulation layer 510, an organic encapsulation layer 520 on the first inorganic encapsulation layer 510, and a second inorganic encapsulation layer 530 on the organic encapsulation layer. However, the present disclosure is not limited thereto.

The first inorganic encapsulation layer 510 may include a light-transmitting inorganic material having a low refractive index, and may be deposited by using a chemical vapor deposition method and/or the like. The first inorganic encapsulation layer 510 may include silicon oxide, magnesium fluoride, and/or the like, and may be a single layer or multiple layers including one or more of the materials described above. A refractive index of the first inorganic encapsulation layer 510 may be in a range of about 1.3 to about 1.6.

The first inorganic encapsulation layer 510 may have a relatively excellent step coverage. In an embodiment, the first inorganic encapsulation layer 510 may be continuously formed to cover an upper surface of the opposite electrode 230, a portion of the side surface of the first line layer 2901, a portion of a lower surface of the second line layer 2903, the side surface of the second line layer 2903, a portion of a side surface of the separator SP, and an upper surface of the dummy opposite electrode 230*b*. The first inorganic encapsulation layer 510 formed as described above may reduce or block a passage through which impurities, such as moisture and/or air, permeate.

The organic encapsulation layer 520 may be formed on the first inorganic encapsulation layer 510. The organic encapsulation layer 520 may bury (e.g., may cover and/or fill) at least some of or all of the holes h1, h2, and h3 and an opening of the pixel-defining layer 115, and may provide a flat or substantially flat base surface to the elements disposed on the organic encapsulation layer 520.

The organic encapsulation layer 520 may include a light-transmitting organic material having a high refractive index. The light-transmitting organic material having the high refractive index may include (e.g., may be) an acryl-based and/or siloxane-based organic material having a refractive index of about 1.6 or more. In an embodiment, the organic encapsulation layer 520 may include acrylate. In an embodiment, the organic encapsulation layer 520 may have a single-layer or multi-layered structure including one or more of the materials described above.

The organic encapsulation layer 520 may include highly refractive particles dispersed in the light-transmitting organic material. For example, the highly refractive particles may include zirconium oxide, zinc oxide, titanium oxide, niobium oxide, tantalum oxide, tin oxide, nickel oxide, silicon nitride, indium nitride, gallium nitride, and/or the like.

The organic encapsulation layer 520 may have a greater refractive index than that of the first inorganic encapsulation layer 510. For example, the refractive index of the organic encapsulation layer 520 may be in a range of about 1.6 to about 2.5. In an embodiment, the organic encapsulation layer 520 may have a multi-layered structure including a plurality of layers having different refractive indices from each other.

In an embodiment, the organic encapsulation layer 520 may be entirely formed on the substrate 100. In this case, the organic encapsulation layer 520 for burying the plurality of holes h1, h2, and h3 or the opening may be integrally formed as a single body, and may provide a flat or substantially flat base surface.

The second inorganic encapsulation layer 530 may be formed on the organic encapsulation layer 520. The second inorganic encapsulation layer 530 may include one or more inorganic materials from among aluminum oxide, titanium oxide, tantalum oxide, hafnium oxide, zinc oxide, silicon oxide, silicon nitride, and silicon oxynitride. The second inorganic encapsulation layer 530 may be a single layer or multiple layers including one or more of the materials described above.

In an embodiment, the second inorganic encapsulation layer 530 may have a refractive index lower than that of the organic encapsulation layer 520. For example, the refractive index of the second inorganic encapsulation layer 530 may be in a range of about 1.3 to about 1.6.

The second inorganic encapsulation layer 530 may prevent or substantially prevent damage to the organic encapsulation layer 520 in a subsequent process, and may provide a flat or substantially flat base surface to the elements located on the second inorganic encapsulation layer 520.

A display apparatus according to an embodiment is described in more detail below with reference to FIGS. 6 to 11.

Figure 8:
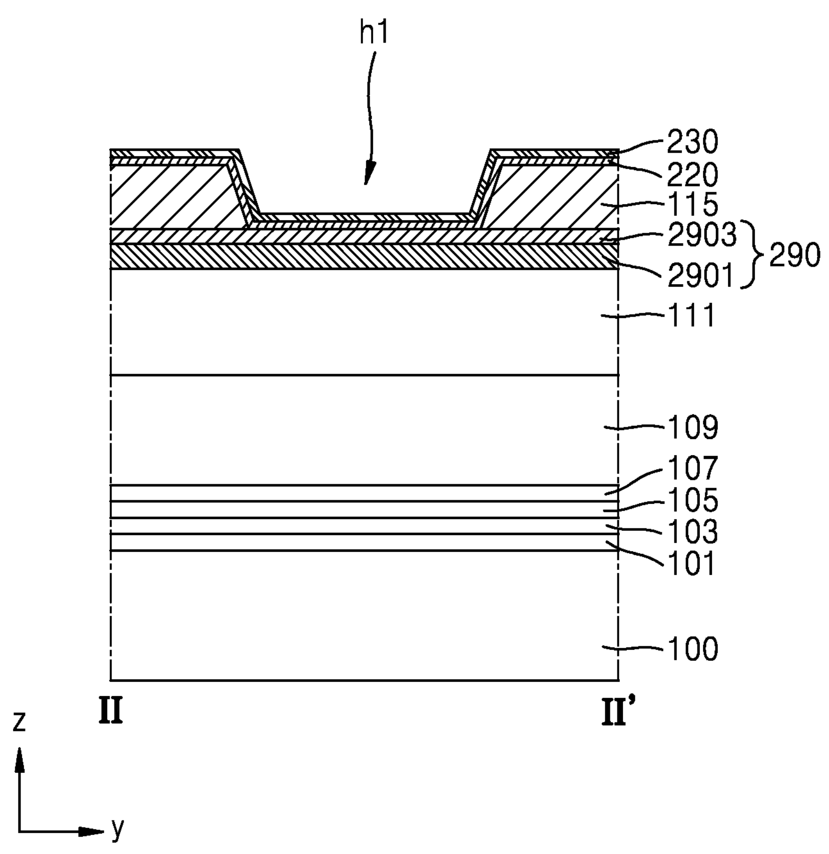
FIG. 8 is a cross-sectional view schematically illustrating the display apparatus taken along the line II-II' of FIG. 6 according to an embodiment.
Figure 9:
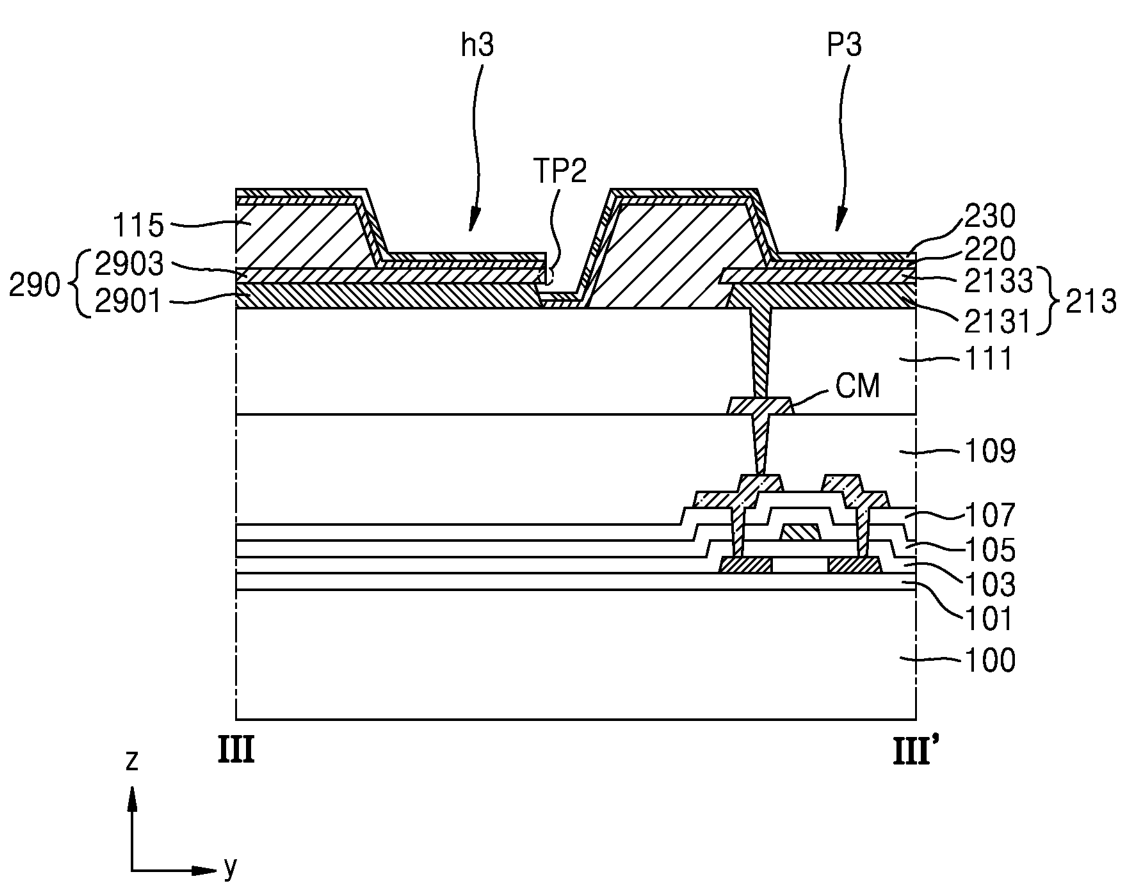
FIG. 9 is a cross-sectional view schematically illustrating the display apparatus taken along the line III-III' of FIG. 6 according to an embodiment.

FIG. 8 is a cross-sectional view schematically illustrating a cross-section of the display device taken along the line II-II' of FIG. 6 according to an embodiment. FIG. 9 is a cross-sectional view schematically illustrating a cross-section of the display device taken along the line III-III' of FIG. 6 according to an embodiment.

Referring to FIGS. 6 and 8, the bus line 290 may be disposed on the second planarization layer 111. The bus line 290 may be arranged to extend in one direction (e.g., the y-axis direction). The pixel-defining layer 115 may be disposed on the bus line 290, and may include the first hole h1 exposing a portion of an upper surface of the second line layer 2903 of the bus line 290. The intermediate layer 220 may be formed to cover the upper surface of the second line layer 2903 exposed through the first hole h1, an upper surface of the pixel-defining layer 115, and a side surface of the pixel-defining layer 115 exposed through the first hole h1 of the pixel-defining layer 115. The opposite electrode 230 may be disposed on the intermediate layer 220. Because the bus line 290 extends in one direction (e.g., the y-axis direction), the opposite electrode 230 may not be in direct contact with the bus line 290 in the II-II' cross-sectional view of the display device of FIG. 6. However, as described above with reference to FIG. 7, referring to a cross-section in a width direction (e.g., the x-axis direction in a case of the bus line 290 exposed through the first hole h1 in FIG. 6 or 7 that is a direction perpendicular to or approximately perpendicular to a direction in which the bus line 290 extends, the side surfaces of the first line layer 2901 and the second line layer 2903 may be exposed through the first hole h1 of the pixel-defining layer 115, and the opposite electrode 230 may be electrically connected to the first line layer 2901 and/or the second line layer 2903. Accordingly, the opposite electrode 230 may transfer a common voltage to the first pixel P1.

Referring to FIG. 9, the third hole h3 may expose an end of a portion of the bus line 290 that additionally extends in a second direction (e.g., the y-axis direction) toward the third pixel P3 from a line extending in a first direction (e.g., the x-axis direction). The end of the bus line 290 toward the third pixel P3 may have an undercut structure. In other words, an end of the second line layer 2903 toward the third pixel P3 may protrude to be closer to the third pixel P3 than an end of the first line layer 2901 toward the third pixel P3, to form a second tip TP2.

The intermediate layer 220 may be disposed on the pixel-defining layer 115, the second line layer 2903 of the bus line 290, and the (3-2)th sub-pixel electrode 2133 of the third pixel electrode 213, and the opposite electrode 230 may be disposed on the intermediate layer 220. The opposite electrode 230 may be electrically connected to the first line layer 2901 and/or the second line layer 2903 of the bus line 290. For example, because a side surface of the first line layer 2901 of the bus line 290 toward the third pixel P3 is exposed through the third hole h3 of the pixel-defining layer 115, and the intermediate layer 220 around the second tip TP2 is disconnected by the second tip TP2 of the second line layer 2903, the opposite electrode 230 may be in contact with a side surface of the first line layer 2901 toward the third pixel P3.

Similarly, because a side surface of the second line layer 2903 of the bus line 290 toward the third pixel P3 is exposed through the third hole h3 of the pixel-defining layer, and the intermediate layer 220 around the second tip TP2 of the second line layer 2903 is disconnected by the second tip TP2, the opposite electrode 230 may be in contact with the side surface of the second line layer 2903 toward the third pixel P3.

Figure 10:
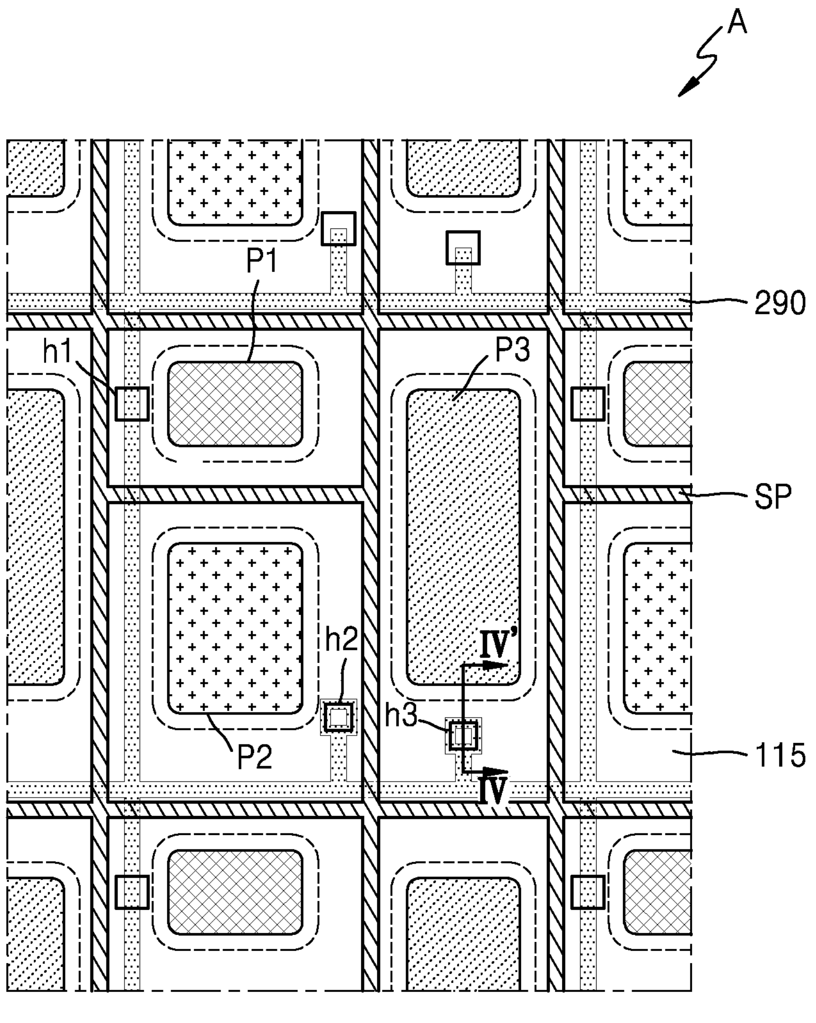
FIG. 10 is an enlarged plan view schematically illustrating the region A of a display apparatus according to another embodiment.
Figure 10:
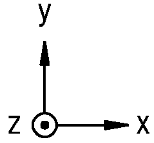
Figure 11:
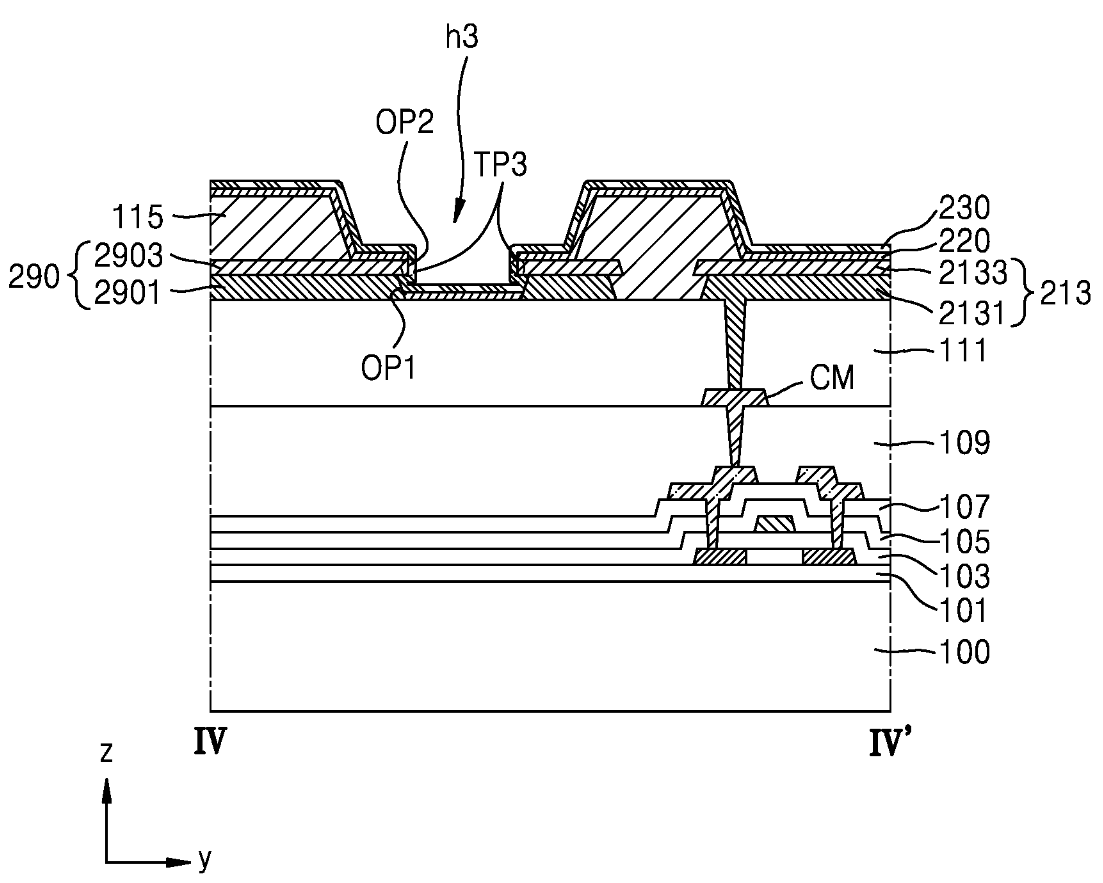
FIG. 11 is a cross-sectional view schematically illustrating the display apparatus taken along the line IV-IV' of FIG. 10.

FIG. 10 is a plan view schematically illustrating the region A of the display apparatus of FIG. 6, according to another embodiment. FIG. 11 is a cross-sectional view schematically illustrating a cross-section of the display apparatus taken along the line IV-IV' of FIG. 10 according to another embodiment.

Referring to FIGS. 10 and 11, an end of the bus line 290 extending toward the second pixel P2 and/or the third pixel P3 may be formed in a loop shape formed along an edge of the second hole h2 and/or the third hole h3, when viewed from the direction (e.g., the z-axis direction) perpendicular to or approximately perpendicular to the substrate 100 (e.g., in a plan view). The second hole h2 and the third hole h3 may have similar configurations to each other, and thus, the third hole h3 may be mainly described in more detail below.

The pixel-defining layer 115 may include the third hole h3 that exposes a portion of the upper surface of the bus line 290 (e.g., a portion of the upper surface of the second line layer 2903), and a side surface of the first line layer 2901 toward a central portion of the third hole h3.

The first line layer 2901 may include the first opening OP1 overlapping with the third hole h3, and passing through a bottom surface of the first line layer 2901 from an upper surface of the first line layer 2901. The second line layer 2903 may include the second opening OP2 overlapping with the third hole h3 and the first opening OP1, and passing through a bottom surface of the second line layer 2903 from an upper surface of the second line layer 2903. The second line layer 2903 may have a third tip TP3 disposed on the first line layer 2901, and protruding toward the central portion of the third hole h3. Accordingly, the second opening OP2 may be formed by a side surface of the third tip TP3 toward the central portion of the third hole h3. The third tip TP3 may protrude more toward the third hole h3 than the side surface of the first line layer 2901 toward the central portion of the third hole h3. Accordingly, a diameter of the second opening OP2 may be less than a diameter of the first opening OP1.

The intermediate layer 220 may be formed to cover an upper surface of the pixel-defining layer 115, a side surface of the pixel-defining layer 115 toward the third hole h3, a side surface of the pixel-defining layer 115 toward a central portion of the third pixel electrode 213, a portion of the upper surface of the second line layer 2903, an upper surface of the second planarization layer 111 exposed by the first opening OP1 and the second opening OP2, and an upper surface of the (3-2)th sub-pixel electrode 2133. The opposite electrode 230 may be formed on the intermediate layer 220. Because the bus line 290 has an undercut shape due to the third tip TP3, the intermediate layer 220 may be disconnected around the third tip TP3. The opposite electrode 230 may be electrically connected to the bus line 290. For example, the opposite electrode 230 may be formed to cover an upper surface of the intermediate layer 220, the side surface of the second line layer 2903 toward the central portion of the third hole h3, and the side surface of the first line layer 2901 toward the central portion of the third hole h3. Accordingly, the opposite electrode 230 may be in contact with the side surface of the first line layer 2901 toward the central portion of the third hole h3, the side surface being exposed by the first opening OP1, and may be in contact with the side surface of the second line layer 2903 toward the central portion of the third hole h3, the side surface being exposed by the second opening OP2. In this case, the opposite electrode 230 may not be disconnected around the third tip TP3. As described above, an area in which the opposite electrode 230 is in contact with the first line layer 2901 and/or the second line layer 2903 may be large. In addition, a process for forming such a contact may be facilitated.

In FIG. 6, in the display apparatus according to an embodiment, the first hole h1 exposes a portion of a mesh structure of the bus line 290, and the second hole h2 and the third hole h3 respectively expose ends of the bus line 290 additionally extending from the mesh structure to be adjacent to the second pixel P2 and the third pixel P3, respectively. In addition, in FIG. 10, in the display apparatus according to another embodiment, ends of the bus line 290 toward the second pixel P2 and the third pixel P3 are formed in a loop shape formed along edges of the second hole h2 and the third hole h3. However, the present disclosure is not limited thereto. A portion of the mesh structure of the bus line 290 or ends of the bus line 290 extending toward the pixel P, the portions and the ends being exposed by the first hole h1, the second hole h2, and the third hole h3, may be modified into a suitable structure as would be known to those having ordinary skill in the art, as long as the opposite electrode 230 and the bus line 290 disposed on the first pixel P1, the second pixel P2, and the third pixel P3 are electrically connected to each other. For example, the first hole h1 may expose an end of the bus line 290 extending toward the first pixel P1, and the second hole h2 may expose a portion of a mesh structure of the bus line 290. As another example, a portion of the bus line 290 may be formed in a loop shape formed along an edge of the first hole h1.

According to one or more embodiments of the present disclosure described above, a display apparatus in which a leakage current may be reduced, and which is capable of effectively transmitting an electrical signal, may be implemented. However, the spirit and scope of the present disclosure are not limited thereto.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
- a display element including a pixel electrode on a substrate;
- a bus line spaced from the pixel electrode, and located at the same layer as that of the pixel electrode;
- a pixel-defining layer defining an emission area of the display element, the pixel-defining layer including:
  - an opening overlapping with the pixel electrode, and exposing at least a portion of the pixel electrode; and
  - a hole exposing a portion of the bus line adjacent to the pixel electrode;
- a separator on the pixel-defining layer;
- an intermediate layer on the pixel electrode; and
- an opposite electrode on the intermediate layer,
- wherein, in a plan view, the separator surrounds the pixel electrode and the hole together, and
- wherein the bus line includes:
  - a first line layer; and
  - a second line layer on the first line layer, the second line layer including a tip protruding more than an edge of the first line layer.

2. The display apparatus of claim 1, wherein the opposite electrode is electrically connected to at least one of the first line layer or the second line layer.

3. The display apparatus of claim 1, wherein the bus line includes:
- a line extending in one direction without overlapping with the pixel electrode; and
- a line extending in a direction different from the one direction without overlapping with the pixel electrode.

4. The display apparatus of claim 1, wherein the tip in an area exposed by the hole protrudes in a direction toward the pixel electrode.

5. The display apparatus of claim 4, wherein the tip in the area exposed by the hole also protrudes in a direction opposite to the pixel electrode.

6. The display apparatus of claim 1, wherein, in a plan view, the bus line in an area exposed by the hole includes a loop shape along an edge of the hole.

7. The display apparatus of claim 6, wherein the first line layer includes a first opening overlapping with the hole, and passing through a bottom surface of the first line layer from an upper surface of the first line layer, wherein the second line layer includes a second opening overlapping with the hole, and passing through a bottom surface of the second line layer from an upper surface of the second line layer, and wherein a diameter of the second opening is less than a diameter of the first opening.

8. The display apparatus of claim 1, wherein the separator has a reverse tapered structure in which an upper width is greater than a lower width.

9. The display apparatus of claim 1, further comprising a third line layer between the first line layer and the second line layer, the third line layer including a conductive material different from a conductive material of the first line layer.

10. The display apparatus of claim 1, wherein the pixel electrode includes a first sub-pixel electrode, and a second sub-pixel electrode on the first sub-pixel electrode, and wherein the second sub-pixel electrode protrudes more than an edge of the first sub-pixel electrode.

11. The display apparatus of claim 1, wherein the intermediate layer includes a lower emission layer, an upper emission layer, and a charge generation layer between the lower emission layer and the upper emission layer.

12. A display apparatus comprising:

a first display element including a first pixel electrode on a substrate;

a second display element including a second pixel electrode on the substrate;

a bus line spaced from the first pixel electrode and the second pixel electrode, and located at the same layer as that of the first pixel electrode and the second pixel electrode on the substrate;

a pixel-defining layer defining emission areas of the first display element and the second display element, the pixel-defining layer including:

an opening overlapping with the first pixel electrode, and exposing at least a portion of the first pixel electrode;

an opening overlapping with the second pixel electrode, and exposing at least a portion of the second pixel electrode;

a first hole exposing a portion of the bus line adjacent to the first pixel electrode; and a second hole exposing a portion of the bus line adjacent to the second pixel electrode;

a separator on the pixel-defining layer;

a first intermediate layer on the first pixel electrode;

a second intermediate layer on the second pixel electrode, and spaced from the first intermediate layer;

a first opposite electrode on the first intermediate layer; and a second opposite electrode on the second intermediate layer, and spaced from the first opposite electrode, wherein, in a plan view, the separator is located between the first pixel electrode and the second pixel electrode, and wherein the bus line includes a first line layer, and a second line layer on the first line layer, the second line layer including a tip protruding more than an edge of the first line layer.

13. The display apparatus of claim 12, wherein the first opposite electrode is electrically connected to at least one of the first line layer or the second line layer in an area of the bus line exposed by the first hole, and wherein the second opposite electrode is electrically connected to at least one of the first line layer or the second line layer in an area of the bus line exposed by the second hole.

14. The display apparatus of claim 12, wherein the first opposite electrode is in direct contact with a side surface of the first line layer in an area of the bus line exposed by the first hole, and wherein the second opposite electrode is in direct contact with a side surface of the first line layer in an area of the bus line exposed by the second hole.

15. The display apparatus of claim 12, wherein:

the separator has a reverse tapered structure in which an upper width is greater than a lower width;

a dummy intermediate layer is on the separator;

a dummy opposite electrode is on the dummy intermediate layer;

the first intermediate layer and the second intermediate layer are disconnected from the dummy intermediate layer; and the first opposite electrode and the second opposite electrode are disconnected from the dummy opposite electrode.

16. The display apparatus of claim 15, wherein the first opposite electrode and the second opposite electrode are electrically connected to each other by the bus line.

17. The display apparatus of claim 12, wherein, in a plan view, the separator surrounds the first pixel electrode and the first hole together, and surrounds the second pixel electrode and the second hole together.

18. A display apparatus comprising:

a display element including a pixel electrode on a substrate;

a bus line spaced from the pixel electrode, and located at the same layer as that of the pixel electrode;

a pixel-defining layer defining an emission area of the display element, the pixel-defining layer including:

an opening overlapping with the pixel electrode, and exposing at least a portion of the pixel electrode; and a hole exposing a portion of the bus line adjacent to the pixel electrode;

an intermediate layer on the pixel electrode; and an opposite electrode on the intermediate layer, wherein the pixel-defining layer includes a separator, wherein, in a plan view, the separator surrounds the pixel electrode and the hole together, and wherein the bus line includes a first line layer, and a second line layer on the first line layer, the second line layer including a tip protruding more than an edge of the first line layer.

19. The display apparatus of claim 18, wherein the separator is formed by removing a portion of the pixel-defining layer so that an upper width of the separator is greater than a lower width of the separator.

20. The display apparatus of claim 18, wherein the opposite electrode is electrically connected to at least one of the first line layer or the second line layer.

* * * * *